(12) United States Patent
Iizuka et al.

(10) Patent No.: US 8,212,299 B2
(45) Date of Patent: Jul. 3, 2012

(54) SEMICONDUCTOR DEVICE HAVING A THIN FILM CAPACITOR OF A MIM (METAL-INSULATOR-METAL) STRUCTURE

(75) Inventors: Toshihiro Iizuka, Tokyo (JP); Tomoe Yamamoto, Tokyo (JP); Mami Toda, Tokyo (JP); Shintaro Yamamichi, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 478 days.

(21) Appl. No.: 10/170,813

(22) Filed: Jun. 13, 2002

(65) Prior Publication Data

US 2002/0190294 A1 Dec. 19, 2002

(30) Foreign Application Priority Data

Jun. 13, 2001 (JP) ................................. 2001-178539

(51) Int. Cl.
*H01L 27/108* (2006.01)
*H01L 29/76* (2006.01)
(52) U.S. Cl. .................... 257/303; 257/306; 257/310
(58) Field of Classification Search .................. 257/296, 257/300, 302–304, 306, 310, 311, E27.048; 438/239–241, 250, 253, 393, 396
See application file for complete search history.

(56) References Cited

U.S. PATENT DOCUMENTS

| | | | |
|---|---|---|---|
| 5,189,503 A | 2/1993 | Suguro et al. | |
| 5,486,712 A | 1/1996 | Arima | |
| 5,567,964 A * | 10/1996 | Kashihara et al. | 257/310 |
| 6,153,460 A * | 11/2000 | Ohnishi et al. | 438/238 |
| 6,207,487 B1 | 3/2001 | Kim et al. | |
| 6,207,561 B1 * | 3/2001 | Hwang et al. | 438/660 |
| 6,281,066 B1 | 8/2001 | Song et al. | |
| 6,335,049 B1 * | 1/2002 | Basceri | 427/79 |
| 6,391,713 B1 * | 5/2002 | Hsue et al. | 438/253 |
| 6,407,420 B1 * | 6/2002 | Yamanaka et al. | 257/296 |
| 6,423,632 B1 * | 7/2002 | Samavedam et al. | 438/655 |
| 6,596,583 B2 * | 7/2003 | Agarwal et al. | 438/250 |
| 6,623,985 B1 * | 9/2003 | Igarashi | 438/3 |
| 2002/0064970 A1 * | 5/2002 | Chooi et al. | 438/785 |
| 2002/0172768 A1 | 11/2002 | Endo et al. | |

(Continued)

FOREIGN PATENT DOCUMENTS

DE 198 38 741 11/1999

(Continued)

OTHER PUBLICATIONS

S. Kamiyama et al., Highly Reliable MIM Capacitor Technology Using Low Pressure CVD-WN Cylinder Storage-Node for 0.12 micrometer-Scale Embedded DRAM. 1999 Symposium on VLSI Technology Digest of Technical Papers, pp. 39-40.*
H. Hu et al., A High Performance MIM Cpacitor Using HfO2 Dielectrics. 2002 IEEE, pp. 514-516.*
X. Yu et al., A High-Density MIM Cpacitor (13 fF/micrometer-2) Using ALD HfO2 Dielectrics. 2003 IEEE, pp. 63-65.*

(Continued)

*Primary Examiner* — Anh Mai
(74) *Attorney, Agent, or Firm* — Young & Thompson

(57) ABSTRACT

In a thin film transistor, each of an upper electrode and a lower electrode is formed of at least one material selected from the group consisting of a metal and a metal nitride, represented by TiN, Ti, W, WN, Pt, Ir, Ru. A capacitor dielectric film is formed of at least one material selected from the group consisting of $ZrO_2$, $HfO_2$, $(Zr_x, Hf_{1-x})O_2$ ($0<x<1$), $(Zr_y, Ti_{1-y})O_2$ ($0<y<1$), $(Hf_z, Ti_{1-z})O_2$ ($0<z<1$), $(Zr_k, Ti_l, Hf_m)O_2$ ($0<k, l, m<1$, $k+l+m=1$), by an atomic layer deposition process. The thin film transistor thus formed has a minimized leakage current and an increased capacitance.

22 Claims, 18 Drawing Sheets

U.S. PATENT DOCUMENTS

2002/0195683 A1 12/2002 Kim et al.

FOREIGN PATENT DOCUMENTS

| | | |
|---|---|---|
| DE | 198 48 444 | 12/1999 |
| DE | 198 53 598 | 2/2000 |
| DE | 100 22 425 | 3/2001 |
| EP | 1 096 042 | 5/2001 |
| GB | 2338594 | 12/1999 |
| GB | 2 353 404 | 2/2001 |
| JP | 6-53408 | 2/1994 |
| JP | 6-151751 | 5/1994 |
| JP | 7-94678 | 4/1995 |
| JP | 7-161934 | 6/1995 |
| JP | 8-124923 | 5/1996 |
| JP | 11-177085 | 7/1999 |
| JP | 11-243177 | 9/1999 |
| JP | 2000-054134 | 2/2000 |
| JP | 2000-114492 | 4/2000 |
| JP | 2000-124424 | 4/2000 |
| JP | 2001-024170 * | 1/2001 |
| JP | 2001-111000 | 4/2001 |
| JP | 2002-343790 | 11/2002 |

OTHER PUBLICATIONS

Japanese Office Action dated Nov. 9, 2004.

M. Copel et al., "Structure and stability of ultrathin zirconium oxide layers on Si(001)", Applied Physics Letters, vol. 76, No. 4, Jan. 24, 2000, pp. 436-438.

M.A. Cameron et al., "ZrO2 film growth by chemical vapor deposition using zirconium tetra-tert-butoxide", Thin Solid Films, 348, 1999, pp. 90-98.

Jane P. Chang et al., "Highly conformal ZrO2 deposition for dynamic random access memory application", Journal of Applied Physics, vol. 90, No. 6, Sep. 15, 2001, pp. 2964-2969.

Weimin Li et al., "High Capacitance and Low Leakage Crystalline Ta2O5 MIM Capacitor for DRAM", Micron Technology, Inc., Boise, ID, Apr. 2001.

Keiko Kushida-Abdelghafar et al., "Electrode-induced degradation of Pb(ZrxTi1-x)O3 (PZT) polarization hysteresis characteristics in Pt/PZT/Pt ferroelectric thin-film capacitors", Appl. Phys. Lett. 69 (21), Nov. 18, 1996, pp. 3188-3190.

German Patent Office issued a German Office Action dated Jul. 15, 2009.

* cited by examiner

Capacitance Drop (Increase of $t_{eq}$)
by Low Dielectric Constant Layer Contribution

RELATED ART

SEMICONDUCTOR DEVICE HAVING A THIN FILM CAPACITOR OF A MIM (METAL-INSULATOR-METAL) STRUCTURE

BACKGROUND OF THE INVENTION

The present invention relates to a semiconductor device having a thin film capacitor and a method for fabricating the same.

Heretofore, in a general purpose DRAM, $Ta_2O_5$ having a high dielectric constant has been considered as a capacitor dielectric film in a memory cell. In this case, it is an ordinary practice that a lower electrode of a capacitor is formed of a polysilicon layer which can be formed to have a concavo-convex surface (for example, so called HSG (hemi-spherical grain) structure) in order to increase a capacitance per a unitary area. In order to form this polysilicon layer, a high temperature process on the order of 700 to 900 degrees Celsius is required.

On the other hand, in a logic mixed DRAM in which a logic section and a memory section are formed on the same chip, gate electrodes and source/drain diffused regions in the logic section are required to be provided with a cobalt (Co) silicide for a speedup of transistors.

The cobalt silicide layer can realize a low resistance, however, if the temperature is elevated, aggregation occurs in the cobalt silicide layer so that the resistance value of the gate electrodes and the diffused layers increases. Therefore, in a process after formation of the cobalt silicide layer, the process temperature cannot be elevated. For example, in the generation of the gate length of 0.15 micron, about 600 degrees Celsius is an upper limit.

Accordingly, if $Ta_2O_5$ is used to form a capacitor dielectric film in the memory section of the logic mixed DRAM and if a polysilicon layer is used to form a lower capacitor electrode, a high temperature process is required to form the polysilicon layer, with the result that the transistors in the logic section become deteriorated through the high temperature process. Therefore, in the generation of the gate length of 0.15 micron and in succeeding generations, it is not possible to use the polysilicon for the lower capacitor electrode. Under this situation, there is a demand for constitute the electrode of the capacitor with a metal or a metal nitride, for example, TiN (titanium nitride), W (tungsten) or Ru (ruthenium), which can be formed at a low temperature of not greater than 500 degrees Celsius where no aggregation occurs in the cobalt silicide.

Now, explanation will be made on a conventional method for forming a thin film capacitor, using a metal or a metal nitride for the lower capacitor electrode and also using $Ta_2O_5$ for the capacitor dielectric film.

A lower electrode of TiN, W or Ru is formed by a CVD (chemical vapor deposition) or a PVD (physical vapor deposition), and then, a $Ta_2O_5$ capacitor dielectric film is formed by a thermal CVD process. Thereafter, in order to reduce a leakage current in the $Ta_2O_5$ capacitor, a post anneal is carried out with a RTO (rapid thermal oxidation) or a UV-$O_3$ oxidation at a temperature of not less than 500 degrees Celsius. Furthermore, an upper electrode of TiN or another is formed by the CVD process or the PVD process, and then, a patterning is carried out to have a desired shape. Thus, the thin film capacitor of a MIM structure having the capacitor dielectric film formed of $Ta_2O_5$ is obtained.

FIG. 14A is a diagrammatic section view of a capacitor formed of a capacitor dielectric film formed of $Ta_2O_5$ and upper and lower capacitor electrodes of TiN. FIG. 14B is a graph illustrating a relation between an electrode-to-electrode voltage (Vp) and a leakage current in the structure shown in FIG. 14A. FIG. 14B shows the leakage current at temperatures of 25 degrees Celsius, 85 degrees Celsius and 125 degrees Celsius. It would be seen from this figure that the leakage current remarkably increases when the temperature becomes not less than 85 degrees Celsius which is a device operation guarantee temperature.

Furthermore, in a LSI chip, it is considered to form a high dielectric constant thin film capacitor above interconnections in the LSI, so as to use it as a decoupling capacitor. The decoupling capacitor is provided to compensate for a voltage drop which is caused for a parasite inductance existing between a power supply and interconnections of the LSI.

Referring to FIG. 15, a conventional decoupling capacitor is shown. In the prior art, as shown in FIG. 15, a number of laminated ceramic capacitors 93 are located around a LSI chip 92 mounted on a printed circuit substrate 91, so that those capacitors function as the decoupling capacitor. However, a resonance frequency of the laminated ceramic capacitor is on the order of about 80 MHz, and therefore, when the LSI is speeded up to several hundred MHz to several GHz, a satisfactory electric charge compensation cannot be carried out, so that it does not function as the decoupling capacitor.

FIG. 16 illustrates a thin film capacitor used as the decoupling capacitor. A high dielectric constant thin film capacitor is formed over an uppermost interconnection layer in a semiconductor device, so as to constitute an on-chip decoupling capacitor.

As shown in FIG. 16, over a wiring conductor or interconnection (ground line) 94 and a wiring conductor or interconnection (power supply line) 95, a lower electrode film, a capacitor dielectric film and an upper electrode film are deposited in the named order by a CVD process, and then, patterned into a desired shape, so as to form a thin film capacitor composed of a lower electrode 96, a capacitor dielectric film 97 and an upper electrode 98. This thin film capacitor constitutes a decoupling capacitor 99. Here, the lower electrode 96 and the upper electrode 98 are formed of TiN, and the capacitor dielectric film 97 is formed of $Ta_2O_5$. In addition, in order to reduce a leakage current, after the capacitor dielectric film 97 of $Ta_2O_5$ is formed, a UV-$O_3$ anneal is carried out at a temperature of 500 degrees Celsius.

In the case of forming a high dielectric constant thin film capacitor over the uppermost interconnection layer in the semiconductor device to use it as the decoupling capacitor, the demand of a low inductance and a large capacitance is satisfied with a one-chip feature and use of a high dielectric constant capacitor, As mentioned above, in the conventional thin film capacitor having the lower electrode formed of TiN, W or Ru and the capacitor dielectric film of $Ta_2O_5$, it is necessary to carry out the post-anneal in an oxidizing atmosphere since the leakage current is large in a condition just after the formation of $Ta_2O_5$. However, because of this post anneal, the lower electrode layer is oxidized so that a low dielectric constant film is formed. As a result, even if the thickness of the $Ta_2O_5$ film is reduced, a large capacitance cannot be obtained.

In addition, because of the oxidation occurring in the post anneal, a concavo-convex or a peeling occurs in the lower electrode layer, with the result that the yield of production lowers.

Furthermore, as shown in FIG. 14B, although the leakage current is no problem at a room temperature of 25 degrees Celsius, if the temperature is elevated to 85 degrees Celsius and further to 125 degrees Celsius, the leakage current increases, so that a sufficient capacitance characteristics cannot be ensured at a device operation guarantee temperature.

On the other hand, in the case that a high dielectric constant thin film capacitor is formed over the uppermost interconnection layer in the semiconductor device and is used as the decoupling capacitor, the demand of a low inductance and a large capacitance is satisfied with a one-chip feature and use of a high dielectric constant capacitor, but the present method for forming the thin film capacitor has a problem.

It has been proposed to use $Ta_2O_5$, $SrTiO_3$ and $(Ba, Sr)TiO_3$ formed by the PVD process or the CVD process, for the capacitor dielectric film of the above mentioned thin film capacitor. However, in order to obtain a capacitor dielectric film of an excellent quality having a large capacitance in the conventional method utilizing the PVD or CVD process, a high temperature of not less than 400 degrees Celsius is required. In addition, in order to reduce the leakage current, it is also necessary to carry out the post anneal in the oxidizing atmosphere at the temperature of not less than 450 degrees Celsius.

Furthermore, recently, a copper wiring conductor is used for interconnection. Therefore, in the case that a capacitor is formed over the uppermost interconnection layer, if the temperature is elevated to not less than 450 degrees Celsius, the interconnection layer is oxidized, with the result that the characteristics is deteriorated and the yield of production lowers.

In other words, the conventional method for forming the thin film capacitor cannot realize a large-capacitance, low-inductance, one-chip decoupling capacitor which meets with the speedup of the LSI.

BRIEF SUMMARY OF THE INVENTION

Accordingly, it is an object of the present invention to provide a thin film capacitor and a method for forming the same, which have overcome the above mentioned problems of the prior art.

Another object of the present invention is to provide a capacitor which can realize a large capacitance and a small leakage current as a capacitor for a DRAM cell in a memory section of a semiconductor device having the memory section and a logic section formed on the same chip, without deterioration of a transistor characteristics attributable to deterioration in a silicide layer formed in gate electrodes and on source/drain diffused layer regions in the semiconductor device.

Still another object of the present invention is to provide a semiconductor device having the above mentioned capacitor formed after an interconnection layer is formed (namely, above the interconnection layer) and a method for fabricating the same.

The above and other objects of the present invention are achieved in accordance with the present invention by a semiconductor device having a capacitor of a MIM (metal-insulator-metal) structure having a capacitor dielectric film formed of at least one material selected from the group consisting of $ZrO_2$, $HfO_2$, $(Zr_x, Hf_{1-x})O_2 (0<x<1)$, $(Zr_y, Ti_{1-y})O_2 (0<y<1)$, $(Hf_z, Ti_{1-z})O_2 (0<z<1)$, $(Zr_k, Ti_l, Hf_m)O_2$ $(0<k, l, m<1, k+l+m=1)$.

According to another aspect of the present invention, there is provided a semiconductor device including a transistor having a gate electrode and source/drain diffused layers having a refractory metal silicide, wherein a capacitor of a MIM (metal-insulator-metal) structure having a capacitor dielectric film, which is formed of at least one material selected from the group consisting of $ZrO_2$, $HfO_2$, $(Zr_x, Hf_{1-x})O_2 (0<x<1)$, $(Zr_y, Ti_{1-y})O_2 (0<y<1)$, $(Hf_z, Ti_{1-z})O_2 (0<z<1)$, $(Zr_k, Ti_l, Hf_m)O_2 (0<k, l, m<1, k+l+m=1)$, and which is provided on an insulator film formed on the source/drain diffused layer.

According to still another aspect of the present invention, there is provided a semiconductor device wherein a capacitor of a MIM (metal-insulator-metal) structure having a capacitor dielectric film, which is formed of at least one material selected from the group consisting of $ZrO_2$, $HfO_2$, $(Zr_x, Hf_{1-x})O_2(0<x<1)$, $(Zr_y, Ti_{1-y})O_2(0<y<1)$, $(Hf_z, Ti_{1-z})O_2 (0<z<1)$, $(Zr_k, Ti_l, Hf_m)O_2(0<k, l, m<1, k+l+m=1)$, and which is provided on an insulator film formed on an interconnection.

According to a further aspect of the present invention, there is provided a method for fabricating a semiconductor device, comprising the steps of forming a lower electrode of a capacitor, forming on the lower electrode, by means of an atomic layer deposition, a capacitor dielectric film formed of at least one material selected from the group consisting of $ZrO_2$, $HfO_2$, $(Zr_x, Hf_{1-x})O_2(0<x<1)$, $(Zr_y, Ti_{1-y})O_2(0<y<1)$, $(Hf_z, Ti_{1-z})O_2(0<z<1)$, $(Zr_k, Ti_l, Hf_m)O_2(0<k, l, m<1, k+l+m=1)$, and, after formation of the capacitor dielectric film, carrying out a heat treatment at a temperature not lower than a film deposition temperature in the atomic layer deposition.

According to a still further aspect of the present invention, there is provided a method for fabricating a semiconductor device, comprising the steps of forming a lower electrode of a capacitor, forming on the lower electrode, by means of an atomic layer deposition, a capacitor dielectric film formed of at least one material selected from the group consisting of $ZrO_2$, $HfO_2$, $(Zr_x, Hf_{1-x})O_2(0<x<1)$, $(Zr_y, Ti_{1-y})O_2(0<y<1)$, $(Hf_z, Ti_{1-z})O_2(0<z<1)$, $(Zr_k, Ti_l, Hf_m)O_2(0<k, l, m<1, k+l+m=1)$, and, after formation of the capacitor dielectric film, carrying out a heat treatment at a temperature which is not lower than a film deposition temperature in the atomic layer deposition but which is not higher than a temperature where no aggregation of a refractory metal silicide occurs in a gate electrode and source/drain diffused layer regions in the case that the refractory metal silicide is provided in the gate electrode and the source/drain diffused layer regions.

According to a further aspect of the present invention, there is provided a method for fabricating a semiconductor device having a capacitor of a MIM (metal-insulator-metal) structure formed on an insulator film formed on an interconnection, comprising the steps of forming a lower electrode of the capacitor, forming on the lower electrode, by means of an atomic layer deposition, a capacitor dielectric film formed of at least one material selected from the group consisting of $ZrO_2$, $HfO_2$, $(Zr_x, Hf_{1-x})O_2(0<x<1)$, $(Zr_y, Ti_{1-y})O_2(0<y<1)$, $(Hf_z, Ti_{1-z})O_2(0<z<1)$, $(Zr_k, Ti_l, Hf_m)O_2(0<k, l, m<1, k+l+m=1)$, and then, forming an upper electrode on the capacitor dielectric film.

The above and other objects, features and advantages of the present invention will be apparent from the following description of preferred embodiments of the invention with reference to the accompanying drawings.

DETAILED DESCRIPTION OF THE INVENTION

Now, embodiments of the present invention will be described with reference to the drawings.

Figure 1:
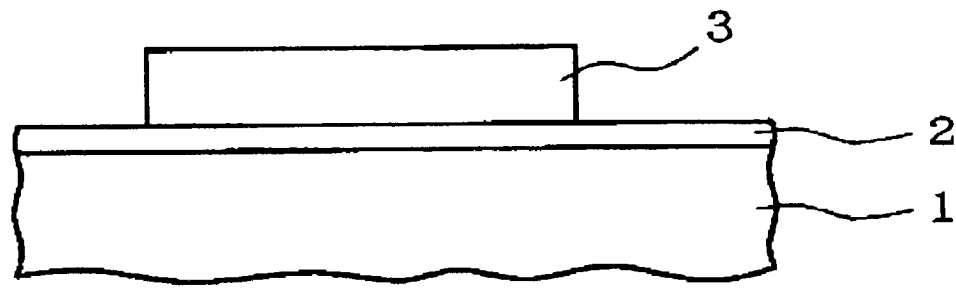
FIG. 1 is a diagrammatic view for illustrating the structure of one embodiment of the thin film capacitor in accordance with the present invention.

Referring to FIG. 1, there is shown a diagrammatic view for illustrating the structure of one embodiment of the thin film capacitor in accordance with the present invention.

The first embodiment is a thin film capacitor of a MIM (metal-insulator-metal) structure, provided in a semiconductor device. This thin film capacitor includes a lower electrode 1, a capacitor dielectric film 2 and an upper electrode 3 stacked in the named order. Each of the upper electrode 3 and the lower electrode 1 is formed of at least one material selected from the group consisting of a metal and a metal nitride, represented by TiN, Ti, W, WN, Pt, Ir, Ru. The capacitor dielectric film 2 is formed of at least one material selected from the group consisting of $ZrO_2$, $HfO_2$, $(Zr_x, Hf_{1-x})O_2$ ($0<x<1$), $(Zr_y, Ti_{1-y})O_2$ ($0<y<1$), $(Hf_z, Ti_{1-z})O_2$ ($0<z<1$), $(Zr_k, Ti_l, Hf_m)O_2$ ($0<k, l, m<1, k+l+m=1$), and formed by means of an atomic layer deposition (abbreviated to "ALD").

Here, $(Zr_x, Hf_{1-x})O_2$ ($0<x<1$) is an oxide of a solid solution of Zr and Hf. $(Zr_y, Ti_{1-y})O_2$ ($0<y<1$) is an oxide of a solid solution of Zr and Ti. $(Hf_z, Ti_{1-z})O_2$ ($0<z<1$) is an oxide of a solid solution of Hf and Ti. $(Zr_k, Ti_l, Hf_m)O_2$ ($0<k, l, m<1, k+l+m=1$) is an oxide of a solid solution of Zr, Ti and Hf.

Here, a method for forming the thin film capacitor in the case that the capacitor dielectric film is formed of $ZrO_2$, will be described. First, a lower electrode thin film having a film thickness of 5 to 50 nm is formed of at least one material selected from the group consisting of TiN, Ti, W, WN, Pt, Ir, Ru, by means of a PVD process, a CVD process or a ALD process, and then, is patterned into a desired shape, so that a lower electrode 1 is formed.

Figure 2:
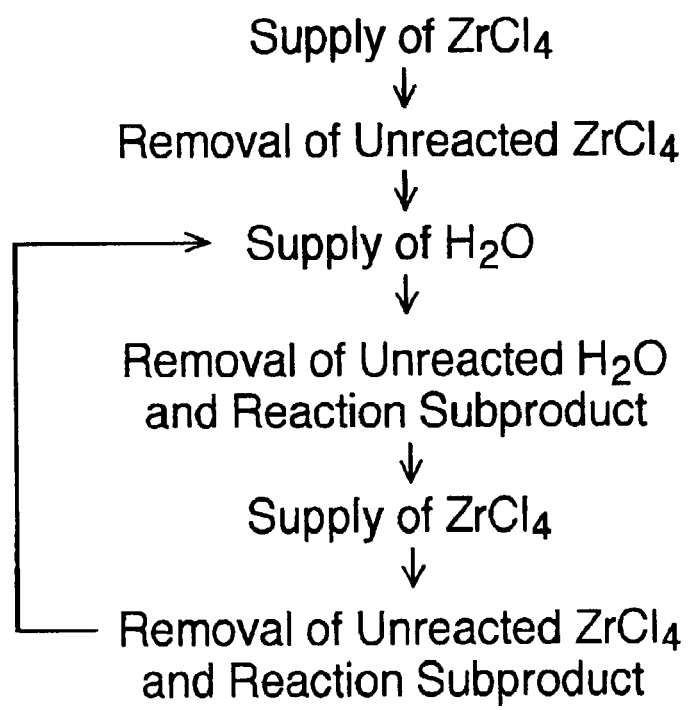
FIG. 2 is a flow chart illustrating a process for forming a $ZrO_2$ thin film by use of an ALD apparatus.

Then, a capacitor dielectric film is formed of $ZrO_2$ by means of the ALD process. FIG. 2 is a flow chart illustrating a process for forming a $ZrO_2$ thin film by use of an ALD apparatus;

The $ZrO_2$ thin film is deposited by using $ZrCl_4$ as a starting material for Zr and $H_2O$ as an oxygen material, under a deposition temperature of 200 to 400 degrees Celsius.

First, $ZrCl_4$ is supplied as a starting material into a chamber of the ALD apparatus, so that only a one-atom layer is deposited on a surface of the lower electrode thin film by causing a reaction. Next, the supply of $ZrCl_4$ is stopped, and an inert gas represented by Ar or $N_2$ is introduced into the chamber as a purge gas so that an excessive unreacted $ZrCl_4$ is removed.

Thereafter, $H_2O$ is supplied to replace a Cl group which terminates Zr grown on the surface of the lower electrode thin film, with an OH group of $H_2O$. In this process, HCl is produced as a reaction subproduct. Then, the supply of $H_2O$ is stopped, and the inert gas represented by Ar or $N_2$ is introduced into the chamber as the purge gas so that an unreacted $H_2O$ and the reaction subproduct HCl are removed.

Then, $ZrCl_4$ is supplied again so that only another one-atom layer is deposited. The supply of $ZrCl_4$ is stopped, and the purge gas is produced so that an unreacted $ZrCl_4$ and the reaction subproduct HCl are removed.

In this manner, a cycle of the $ZrCl_4$ supply, the purge, the $H_2O$ supply and the purge sequentially carried in the named order, is repeated necessary times, until the capacitor dielectric film 2 of $ZrO_2$ having the film thickness of 5 to 15 nm is obtained.

After the $ZrO_2$ thin film is formed, an upper electrode thin film having a film thickness of 5 to 50 nm is formed of at least one material selected from the group consisting of TiN, Ti, W, WN, Pt, Ir, Ru, by means of a PVD process, a CVD process or a ALD process, and then, is patterned into a desired shape, so that an upper electrode 3 is formed. Thus, the thin film capacitor is obtained.

The thin film capacitor formed as mentioned above has a small leakage current and a large capacitance, because the capacitor dielectric film is formed of $ZrO_2$ having a high electrical insulation property and a large dielectric constant, and because a leakage current increase is small even if the film thickness of $ZrO_2$ is reduced.

In addition, if the $ZrO_2$ thin film is formed by the ALD process, it is possible to carry out a film formation at a low temperature and to omit a post anneal which is carried out in an oxidizing atmosphere. Therefore, it is possible to avoid the drop of the capacitance, the increase of the leakage current and the drop in the yield of production, caused by oxidation of the lower electrode.

Figure 3:
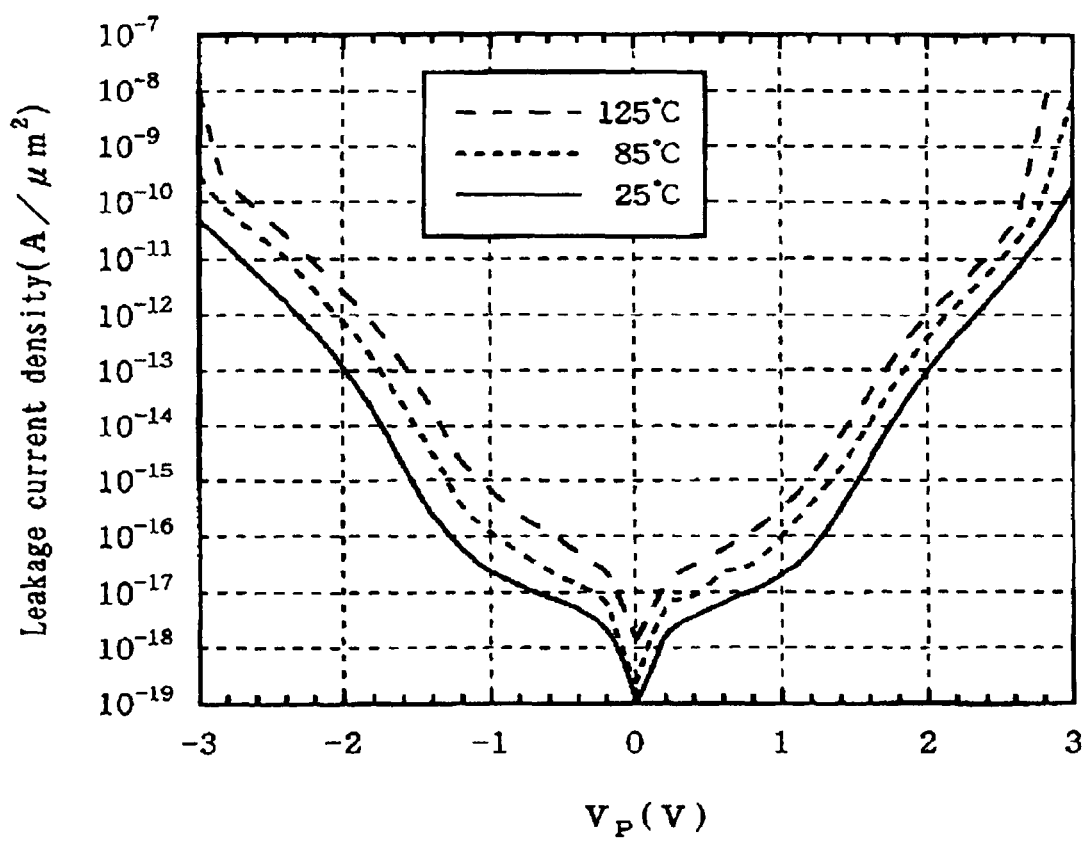
FIG. 3 is a graph illustrating a relation between an electrode-to-electrode voltage (Vp) of a thin film capacitor and a leakage current.
Figure 14A:
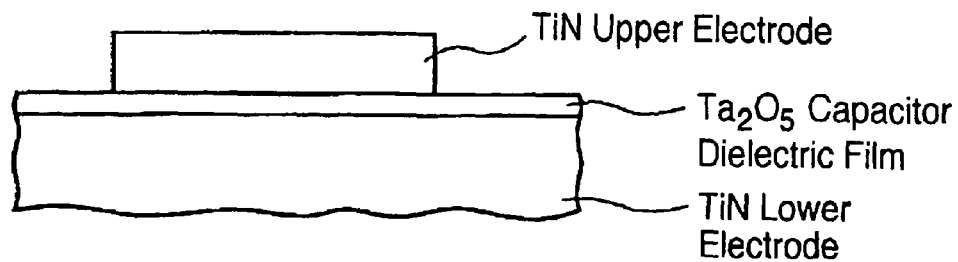
FIG. 14A is a diagrammatic sectional view of a conventional capacitor formed of a capacitor dielectric film formed of $Ta_2O_5$ and upper and lower capacitor electrodes of TiN.
Figure 14B:
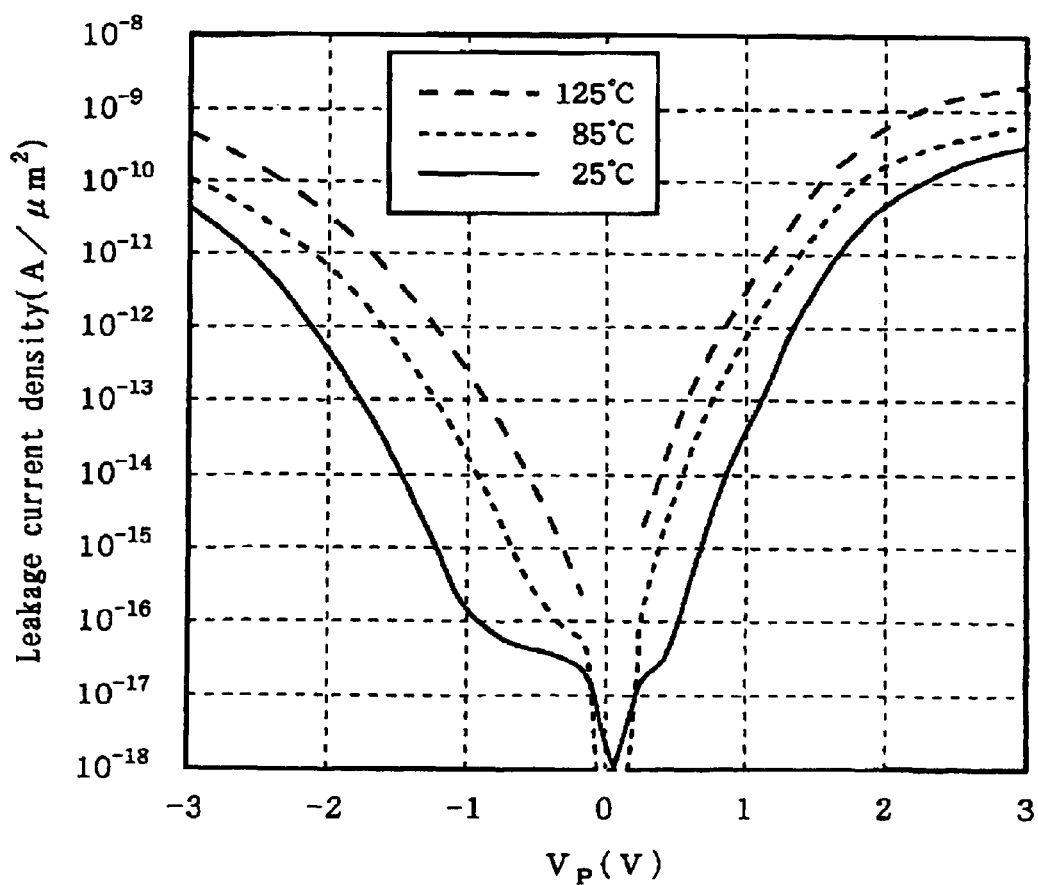
FIG. 14B is a graph illustrating a relation between an electrode-to-electrode voltage (Vp) and a leakage current in the conventional capacitor shown in FIG. 14A.

Referring to FIG. 3, there is shown a graph illustrating a relation between an electrode-to-electrode voltage (Vp) of a thin film capacitor and a leakage current in the case that the capacitor dielectric film is formed of $ZrO_2$ and the upper and lower electrodes are formed of TiN. From comparison of FIG. 3 with FIG. 14B, it would be seen that the leakage current evidently becomes small in comparison with the thin film capacitor having the capacitor dielectric film formed of $Ta_2O_5$, shown in FIG. 14A.

In the above mentioned embodiment, the capacitor dielectric film is formed of $ZrO_2$ deposited by the ALD process. However, a similar advantage can be obtained in the case that the capacitor dielectric film is formed of at least one material selected from the group consisting of $HfO_2$, $(Zr_x, Hf_{1-x})O_2$ ($0<x<1$), $(Zr_y, Ti_{1-y})O_2$ ($0<y<1$), $(Hf_z, Ti_{1-z})O_2$ ($0<z<1$), and $(Zr_k, Ti_l, Hf_m)O_2$ ($0<k, l, m<1, k+l+m=1$).

In the case that the capacitor dielectric film is formed of $HfO_2$, $HfCl_4$ is used as a starting material for Hf, and $H_2O$ is used as an oxygen material.

In the case that the capacitor dielectric film is formed of $(Zr_x, Hf_{1-x})O_2$, $ZrCl_4$ is used as a starting material for Zr, $HfCl_4$ is used as a starting material for Hf, and $H_2O$ is used as an oxygen material.

In the case that the capacitor dielectric film is formed of $(Zr_y, Ti_{1-y})O_2$, $ZrCl_4$ is used as a starting material for Zr, $TiCl_4$ is used as a starting material for Ti, and $H_2O$ is used as an oxygen material.

In the case that the capacitor dielectric film is formed of $(Hf_z, Ti_{1-z})O_2$, $HfCl_4$ is used as a starting material for Hf, $TiCl_4$ is used as a starting material for Ti, and $H_2O$ is used as an oxygen material.

In the case that the capacitor dielectric film is formed of $(Zr_k, Ti_l, Hf_m)O_2$, $ZrCl_4$ is used as a starting material for Zr, $TiCl_4$ is used as a starting material for Ti, $HfCl_4$ is used as a starting material for Hf, and $H_2O$ is used as an oxygen material.

Now, a second embodiment of the present invention will be described.

According to this second embodiment, in a thin film capacitor of a MIM structure having a capacitor dielectric film formed of at least one material selected from the group consisting of $ZrO_2$, $HfO_2$, $(Zr_x, Hf_{1-x})O_2 (0<x<1)$, $(Zr_y, Ti_{1-y})O_2 (0<y<1)$, $(Hf_z, Ti_{1-z})O_2 (0<z<1)$, $(Zr_k, Ti_l, Hf_m)O_2$ $(0<k, l, m<1, k+l+m=1)$, deposited by means of the ALD process, an anneal is carried out after formation of the capacitor dielectric film.

The thin film capacitor of the MIM structure in accordance with the first embodiment having the capacitor dielectric film formed of at least one material selected from the group consisting of $ZrO_2$, $HfO_2$, $(Zr_x, Hf_{1-x})O_2 (0<x<1)$, $(Zr_y, Ti_{1-y})O_2$ $(0<y<1)$, $(Hf_z, Ti_{1-z})O_2 (0<z<1)$, $(Zr_k, Ti_l, Hf_m)O_2 (0<k, l, m<1, k+l+m=1)$, has a small leakage current and a large capacitance, in comparison with the thin film capacitor having the capacitor dielectric film formed of $Ta_2O_5$, and therefore, can be satisfactorily used as a memory capacitor in a DRAM cell. However, when the film thickness of the capacitor dielectric film is decreased, the capacitance increase is small (namely, the decrease of teq is small), and on the other hand, the leakage current increases.

Figure 4:
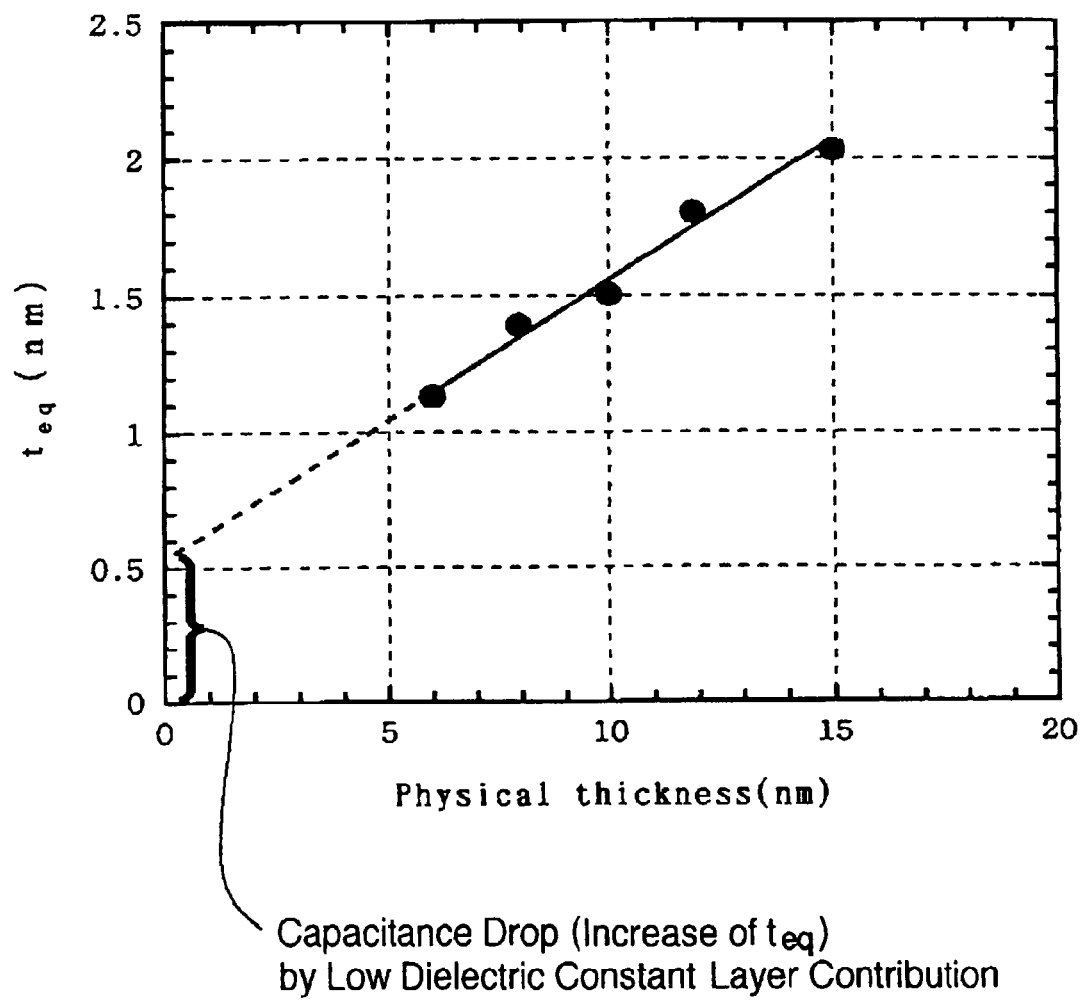
FIG. 4 is a graph illustrating a relation between teq (film thickness converted into $SiO_2$) and an actual film thickness.

Referring to FIG. 4, there is shown a graph illustrating a relation between teq (film thickness converted into $SiO_2$) and an actual film thickness when the capacitor dielectric film formed of $ZrO_2$ and the upper and lower electrodes are formed of TiN. A capacitance drop caused by a low dielectric constant layer contribution would be seen from FIG. 4.

The reason for this is considered as follows: Just after the deposition of the $ZrO_2$ thin film, a $ZrO_2$ boundary layer having poor crystallinity exists, which act as a low dielectric constant layer. Therefore, even if the film thickness is decreased, the low dielectric constant layer contribution is large, with the result that the capacitance of the capacitor as a whole cannot be correspondingly increased. On the other hand, the leakage current increases with the decrease of the film thickness.

In this second embodiment, on the other hand, in the thin film capacitor formed in accordance with the first embodiment, namely, in the thin film capacitor of the MIM structure having the capacitor dielectric film formed of the $ZrO_2$ thin film formed by the ALD process, the anneal is carried out at a temperature of 300 to 700 degrees Celsius after the deposition of the $ZrO_2$ thin film. As a result, a further large capacitance and a small leakage current are realized in the thin film capacitor.

As mentioned above, the thin film capacitor having the $ZrO_2$ thin film deposited on a metal electrode by the ALD process can be used as a memory capacitor in the DRAM cell.

However, in order to meet with the demand for a further microminiaturization and a further high integration, it is preferred to obtain a further large capacitance and a small leakage current.

The inventors of the present application uncovered that if an $ZrO_2$ thin film is only deposited on a metal electrode by the ALD process, an amorphous $ZrO_2$ layer region exists at a boundary between the lower electrode and the $ZrO_2$ layer, and it is not possible to obtain a characteristics intrinsic to the MIM structure thin film capacitor having the capacitor dielectric film of $ZrO_2$. Namely, since the amorphous layer functions as a low dielectric constant layer in the MIM structure thin film capacitor, the obtained capacitance drops.

Furthermore, the inventors of the present application uncovered and confirmed that the amorphous $ZrO_2$ layer is crystallized by carrying out the anneal after the deposition of the $ZrO_2$ layer. With this crystallization, the $ZrO_2$ layer is homogenized, so that the above mentioned low dielectric constant boundary layer is removed. As a result, it was confirmed that a further large capacitance and a small leakage current are obtained in comparison with the case that no anneal was carried out.

For example, the $ZrO_2$ capacitor dielectric film is deposited on the lower electrode of TiN by the ALD process at a temperature of 200 to 400 degrees Celsius, and thereafter, for example, the upper electrode of TiN is formed, and then, is patterned into a desired shape, so that the MIM thin film capacitor is obtained. Thereafter, the MIM thin film capacitor thus obtained is annealed at a temperature which is not lower than a $ZrO_2$ layer deposition temperature and which is in a range of 300 to 700 degrees Celsius.

Incidentally, the above mentioned amorphous layer is formed when the capacitor dielectric film is deposited, and the anneal may be carried out at any time after the deposition of the capacitor dielectric film. For example, a similar advantage can be obtained even if the anneal is carried out immediately after the deposition of the capacitor dielectric film or even if the anneal is carried out after the formation of the upper electrode.

In addition, the atmosphere in which the anneal is carried out is not important, but it is preferable to use a non-oxidizing atmosphere which does not cause a characteristics deterioration attributable to oxidation of the low electrode material, namely, $N_2$, Ar, He, or a forming gas $(H_2+N_2)$.

Figure 5:
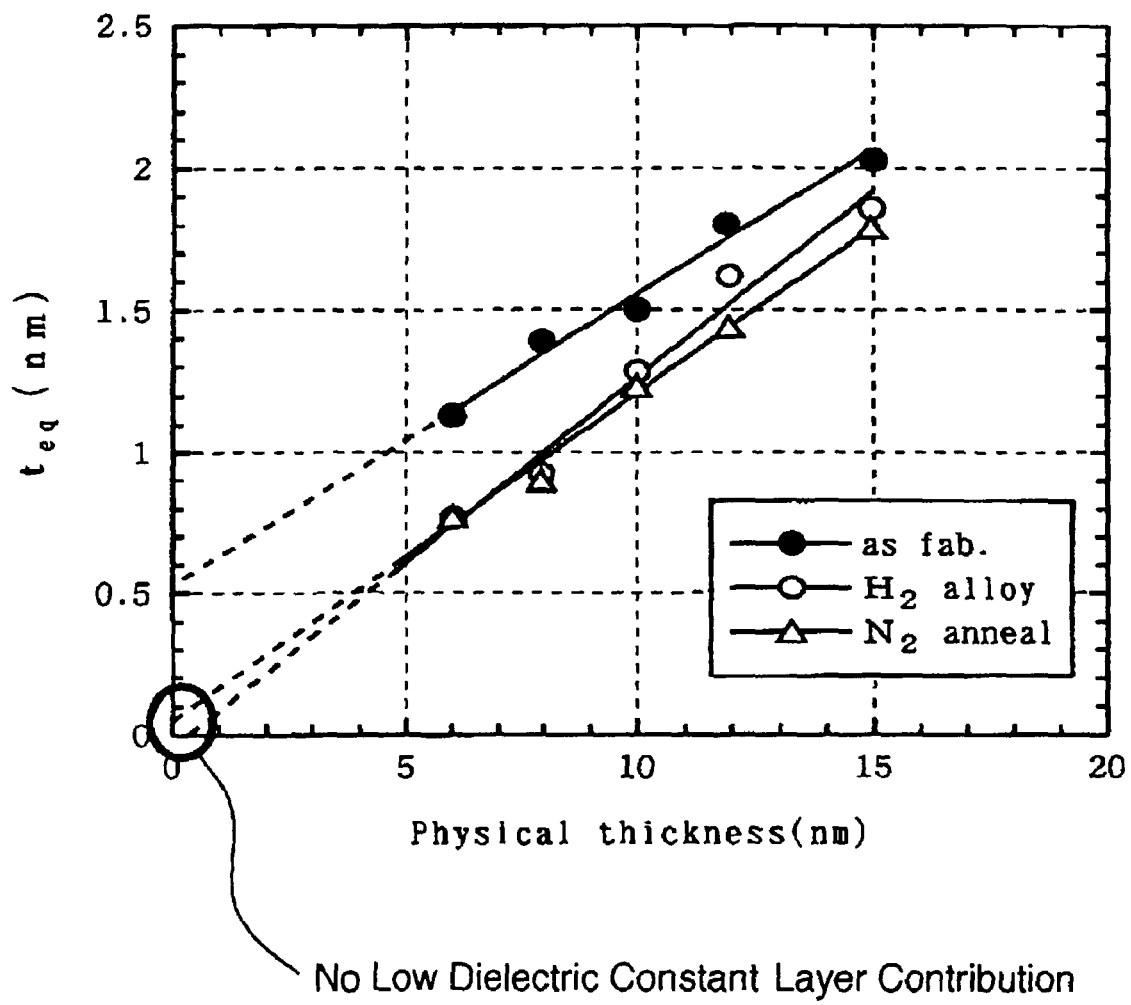
FIG. 5 is a graph illustrating a relation between teq (film thickness converted into $SiO_2$) and an actual film thickness.

Referring to FIG. 5, there is shown a graph illustrating a relation between teq (film thickness converted into $SiO_2$) and an actual film thickness in the case that the capacitor dielectric film is formed of $ZrO_2$ and the upper and lower electrodes are formed of TiN. It could be seen from FIG. 5 that, if the anneal is carried out, the low dielectric constant layer contribution becomes null. In FIG. 5, a black solid circle indicates the thin film capacitor formed with no anneal, which is the same as the thin film capacitor shown in FIG. 4. A white circle indicates the thin film capacitor formed by carrying out the anneal under the atmosphere of a mixed gas of hydrogen and nitrogen, and a triangle indicates the thin film capacitor formed by carrying out the anneal under the atmosphere of only nitrogen.

Figure 6:
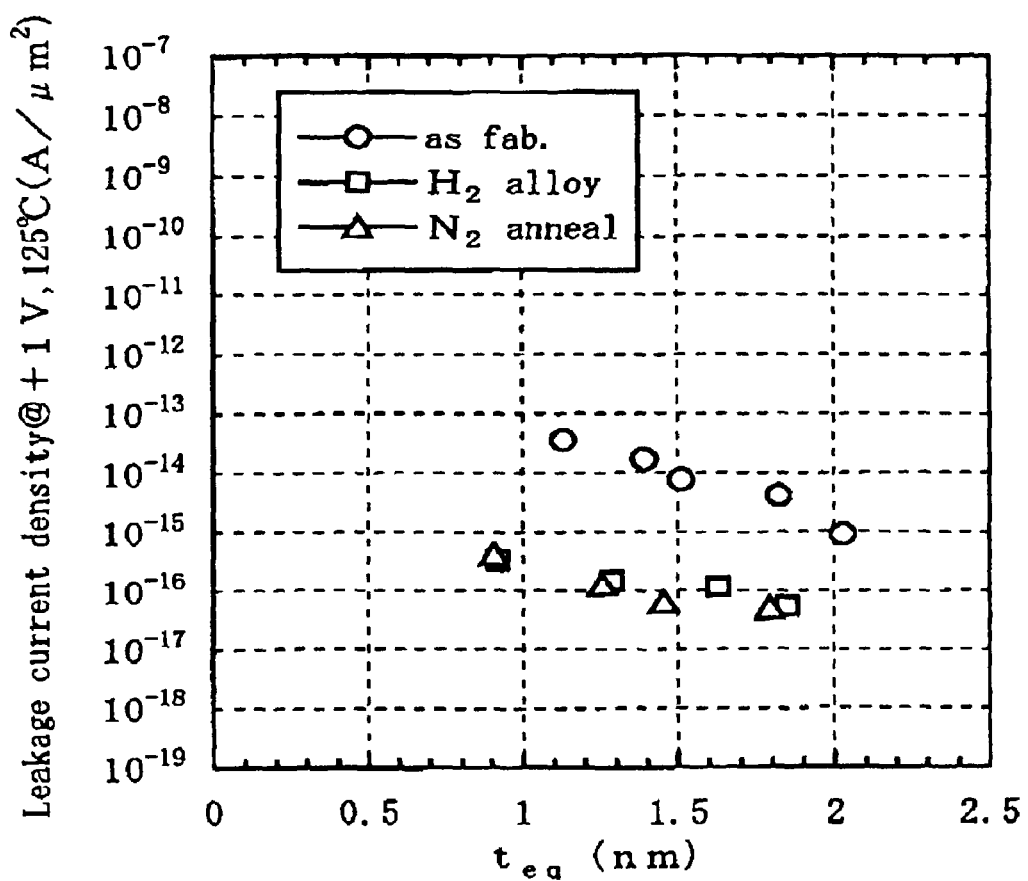
FIG. 6 is a graph illustrating a relation between a leakage current and teq (film thickness converted into $SiO_2$)

Referring to FIG. 6, there is shown a graph illustrating a relation between a leakage current and teq (film thickness converted into $SiO_2$) in the case that the capacitor dielectric film is formed of $ZrO_2$ and the upper and lower electrodes are formed of TiN. In FIG. 6, a white circle indicates the thin film capacitor formed with no anneal. A square indicates the thin film capacitor formed by carrying out the anneal under a mixed gas of hydrogen and nitrogen, and a triangle indicates the thin film capacitor formed by carrying out the anneal under only a nitrogen. It could be seen from FIG. 6 that the case of carrying out the anneal under the mixed gas of hydrogen and nitrogen and the case of carrying out the anneal under only the nitrogen exhibit substantially the same leakage current value. Therefore, it would be seen that only the heat treatment is effective, and the atmosphere for the anneal does not give any influence.

As seen from the above, in the thin film capacitor of the second embodiment, the low dielectric constant layer ($ZrO_2$ boundary layer having poor crystallinity) existing just after the deposition of the $ZrO_2$ thin film, is improved in crystallinity by the anneal, so that it no longer functions as the low dielectric constant layer. As a result, the capacitance is increased (namely, teq is decreased). In addition, since crystallinity is improved in the whole of the $ZrO_2$ thin film, the leakage current is decreased.

In the above mentioned second embodiment, the capacitor dielectric film is formed of $ZrO_2$. However, a similar advantage can be obtained in the case that the capacitor dielectric film is formed of at least one material selected from the group consisting of $HfO_2$, $(Zr_x, Hf_{1-x})O_2 (0<x<1)$, $(Zr_y, Ti_{1-y})O_2 (0<y<1)$, $(Hf_z, Ti_{1-z})O_2 (0<z<1)$, and $(Zr_k, Ti_l, Hf_m)O_2 (0<k, l, m<1, k+l+m=1)$.

In addition, when the thin film capacitor of the second embodiment is formed in a semiconductor device having a transistor in which a refractory metal silicide is provided in a gate electrode and source/drain diffused layer regions, the anneal condition is required at a temperature which is not lower than the $ZrO_2$ deposition temperature in the ALD process but which is not higher than a temperature where no aggregation of the refractory metal silicide occurs in the gate electrode and the source/drain diffused layer regions. The aggregation of the silicide is remarkable in a region having a small area, namely, in the gate electrode rather than the source/drain diffused layer regions. For example, in the device on the generation of the gate length 0.15 micron, the aggregation temperature is about 600 degrees Celsius. In this case, the anneal temperature is not lower than the $ZrO_2$ deposition temperature in the ALD process but not higher than 600 degrees Celsius.

Now, a third embodiment of the present invention will be described.

According to this third embodiment, in a stacked MIM (metal-insulator-metal) capacitor in a DRAM or a logic mixed DRAM having a logic section and a memory section formed on the same chip, a lower electrode, a capacitor dielectric film and an upper electrode are sequentially formed in the ALD process by use of an ALD apparatus.

Figure 7:
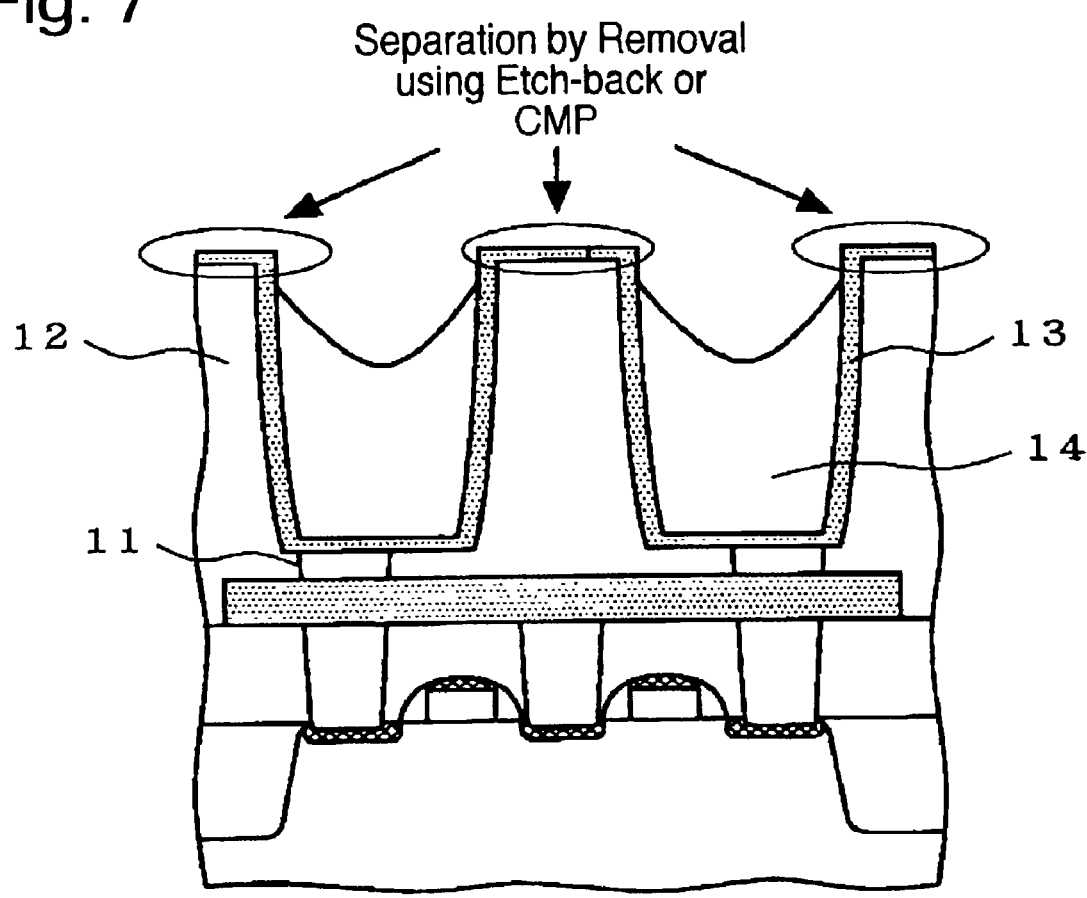
FIGS. 7 and 8 are diagrammatic sectional views for illustrating a conventional method for forming a stacked MIM capacitor.
Figure 8:
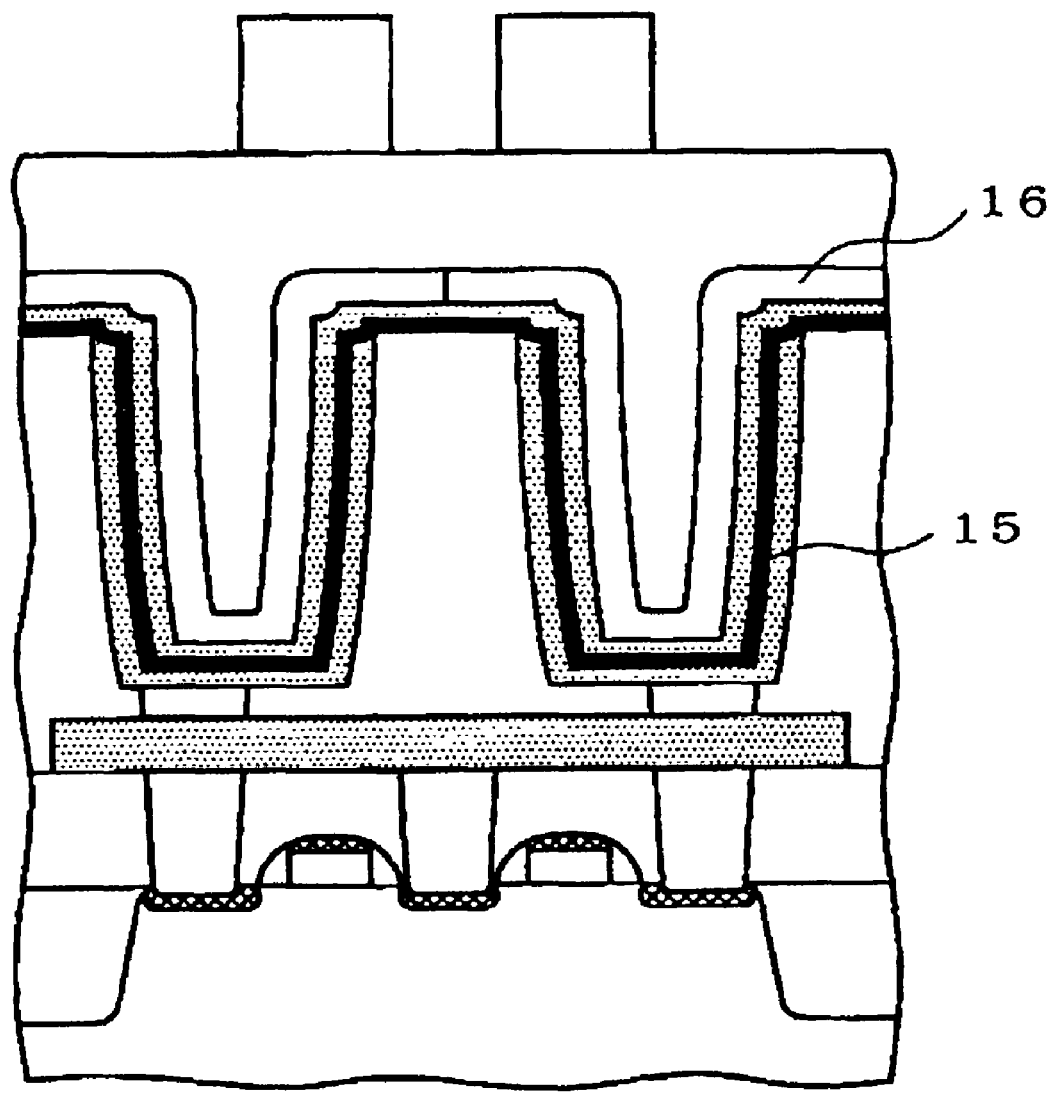

First, a conventional method for forming the stacked MIM capacitor in a DRAM or a logic mixed DRAM will be described. As shown in FIG. 7, a transistor is formed, and after a capacitor contact 11 is formed, an interlayer insulator film 12 is deposited. Then, an opening is formed in the interlayer insulator film 12 by use of lithography, and a lower electrode (metal) 13 is deposited. Thereafter, a resist 14 is filled into the opening to protect the opening, and only an upper portion of the interlayer insulator film is removed by an etch-back process or a CMP (chemical mechanical polishing) process, so that capacitors are separated from each other. Then, as shown in FIG. 8, a capacitor dielectric film 15 and an upper electrode 16 are deposited, and a patterning is carried out to form a common electrode conductor (capacitor plate).

In this conventional method for forming the stacked MIM capacitor, when the lower electrode is selectively removed, it is necessary to charge the resist 14 into the opening so as to prevent a portion which will become the lower electrode of the capacitor, from the etching. For the purpose of removing this resist, it is possible to remove this resist by using acid, in a MIS (metal-insulator-silicon) capacitor having the lower electrode formed of polysilicon. However, in the MIM capacitor having the lower electrode formed of a metal such as TiN, it is impossible to remove this resist by using acid (SPM (sulfuric acid—peroxide mixture). Therefore, the resist is removed by a plasma removal processing plus an organic removal processing. However, this removal method is difficult to completely remove depositions which were generated in the etching and a removal residue of the resist.

Furthermore, in conventional method for forming the stacked MIM capacitor, it is difficult to avoid a plasma damage to the surface of the lower electrode when the lower electrode is selectively removed and when the resist is removed. In addition, since impurity such as carbon in atmosphere of a clean room deposits on the surface of the lower electrode, it is also difficult to maintain a boundary between the lower electrode and the capacitor dielectric film in a good condition, with the result that the characteristics of the capacitor dielectric film is deteriorated.

In the third embodiment of the present invention, on the other hand, in a thin film capacitor of a MIM structure in which each of an upper electrode and a lower electrode is formed of at least one material selected from the group consisting of a metal and a metal nitride, represented by TiN, Ti, W, WN, Pt, Ir, Ru, and a capacitor dielectric film is formed of at least one material selected from the group consisting of $ZrO_2$, $HfO_2$, $(Zr_x, Hf_{1-x})O_2 (0<x<1)$, $(Zr_y, Ti_{1-y})O_2 (0<y<1)$, $(Hf_z, Ti_{1-z})O_2 (0<z<1)$, $(Zr_k, Ti_l, Hf_m)O_2 (0<k, l, m<1, k+l+m=1)$, the lower electrode, the capacitor dielectric film and the upper electrode are sequentially formed in the same machine in the ALD process by using an ALD apparatus. With this arrangement, a boundary between the lower electrode and the capacitor dielectric film can be maintained in a good condition.

Now, a method in accordance with the third embodiment of the present invention for forming the stacked MIM capacitor in the DRAM or the logic mixed DRAM, will be described with reference to diagrammatic sectional views of FIGS. 9A to 9N. Here, explanation will be made on a cylinder type capacitor, which is one kind of the stacked capacitor, and which includes a capacitor dielectric film formed of $ZrO_2$ and upper and lower electrodes formed of TiN.

Figure 9A:
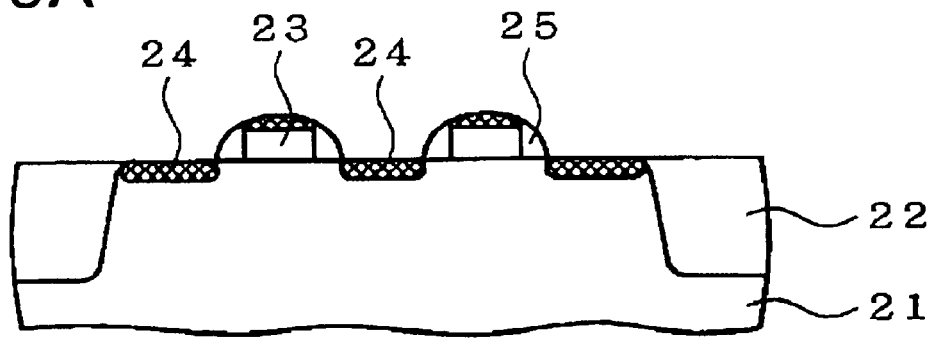
FIGS. 9A to 9N are diagrammatic sectional views for illustrating a method for forming a stacked MIM capacitor in accordance with the present invention.

First, as shown in FIG. 9A, a device isolation region 22 is formed on a principal surface of a semiconductor substrate (silicon substrate) 21 to confirm a device formation region. In the device formation region, a gate electrode 23 is formed on a not-shown gate insulator film, and a source/drain diffused region 24 is formed in a surface region of the substrate at each side of the gate electrode. This gate electrode 23 forms a word line in the DRAM. Then, a side wall 25 is formed on each side of the gate electrode 23, and Co (cobalt) or Ni (nickel) is deposited on the gate electrodes 23 and the source/drain diffused regions 24 to form a cobalt silicide or a nickel silicide. Thus, MOS transistors are formed.

Figure 9B:
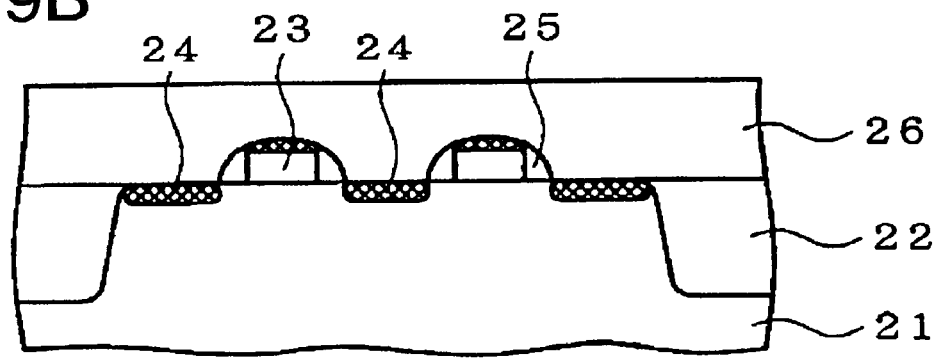

Then, as shown in FIG. 9B, an interlayer insulator film 26 is formed to cover the transistors, and an upper surface of the interlayer insulator film 26 is planarized.

Figure 9C:
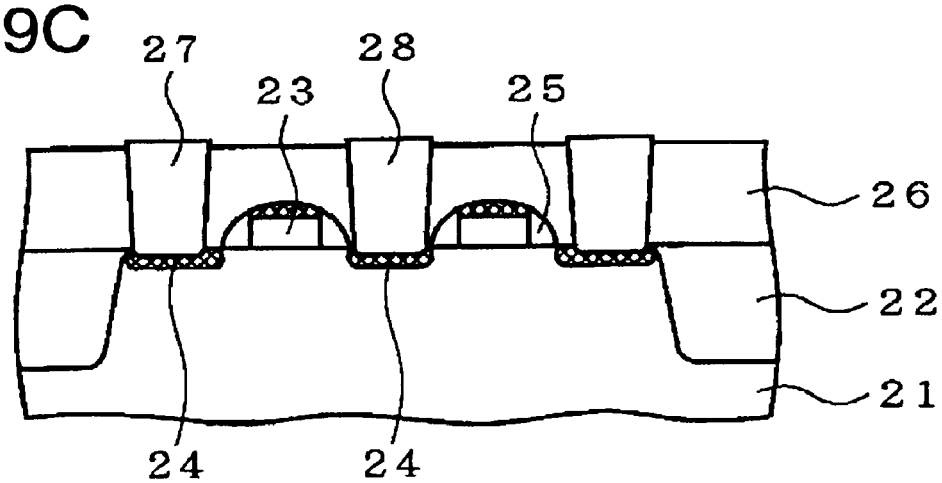

As shown in FIG. 9C, a hole for a cell contact (capacitor contact) 27 and a hole for a cell contact (bit contact) 28 are formed in the interlayer insulator film 26 to reach the source/drain diffused regions 24 by a lithography, and W (tungsten) is charged into the holes thus formed, to form a W plug.

Figure 9D:
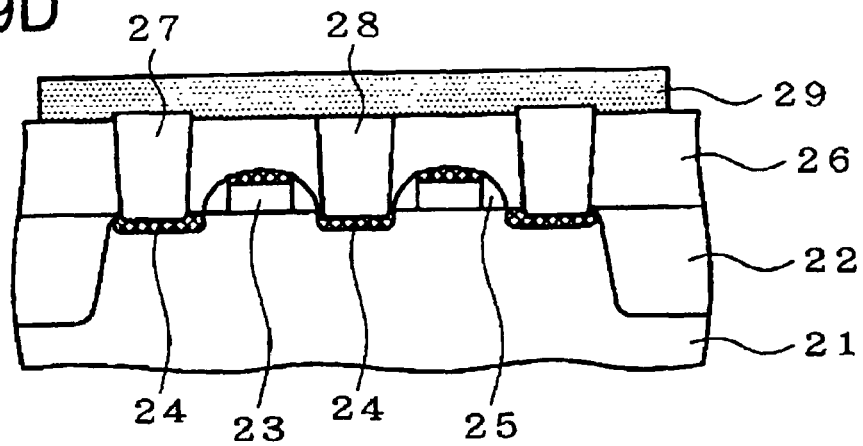

As shown in FIG. 9D, a bit line conductor layer is formed on the interlayer insulator film 26 and the cell contacts 27 and 28, and is patterned to form a bit line 29 electrically connected to the W plug of the cell contact 28.

Figure 9E:
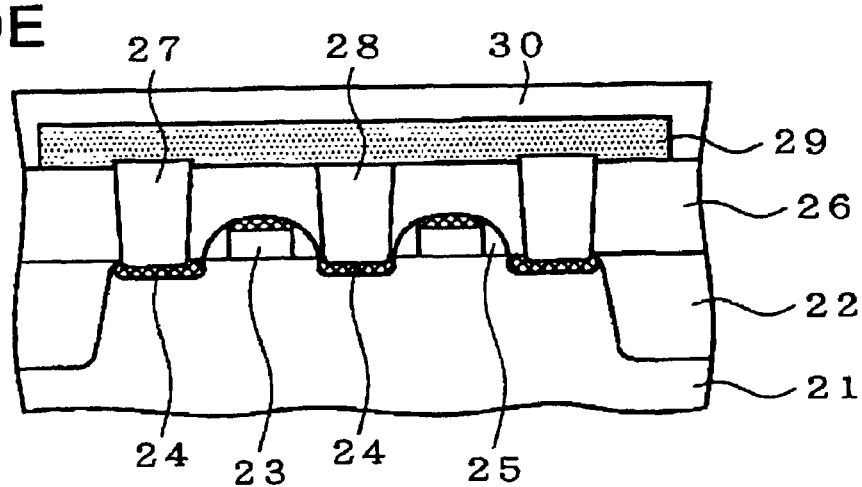

As shown in FIG. 9E, an interlayer insulator film 30 is deposited to cover the bit line 29, and then, and an upper surface of the interlayer insulator film 30 is planarized.

Figure 9F:
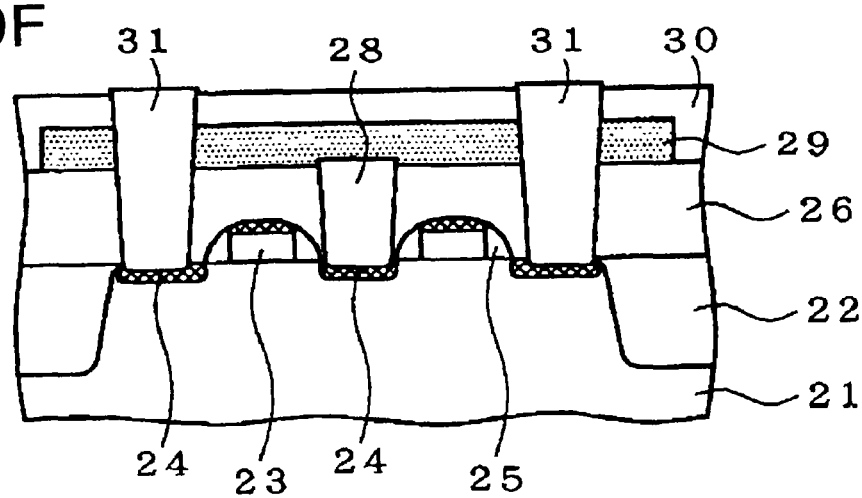

As shown in FIG. 9F, a hole for a capacitor contact 31 is formed in the interlayer insulator film 30 to reach the cell contact 27 by a lithography, and W (tungsten) is charged into the hole thus formed, to form a W plug.

Figure 9G:
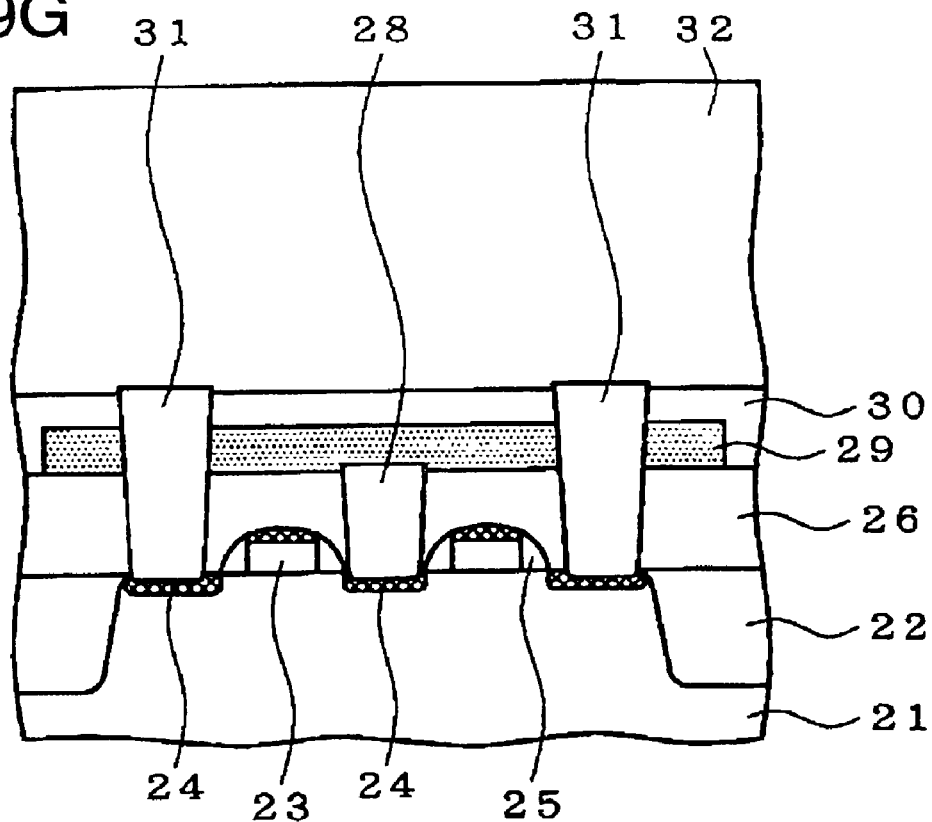

As shown in FIG. 9G, an interlayer insulator film 32 is formed to cover the interlayer insulator film 30 and the capacitor contact 31.

Figure 9H:
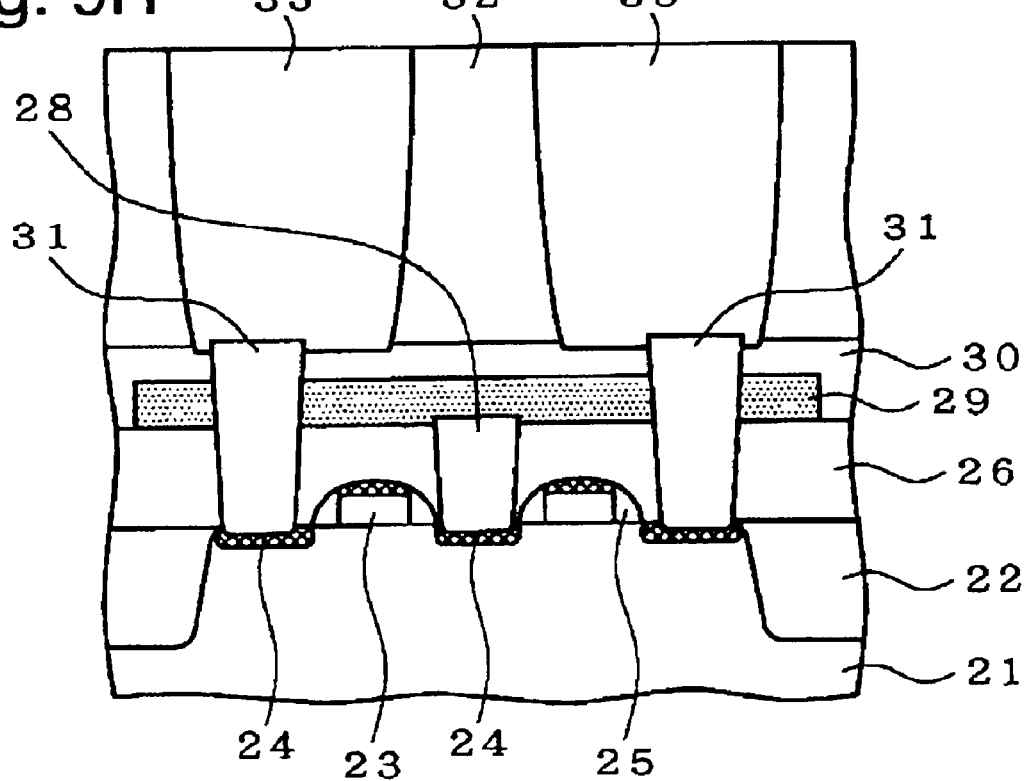

As shown in FIG. 9H, a cylinder 33 is formed in the interlayer insulator film 32 to reach the capacitor contact 31 by a lithography.

Figure 9I:
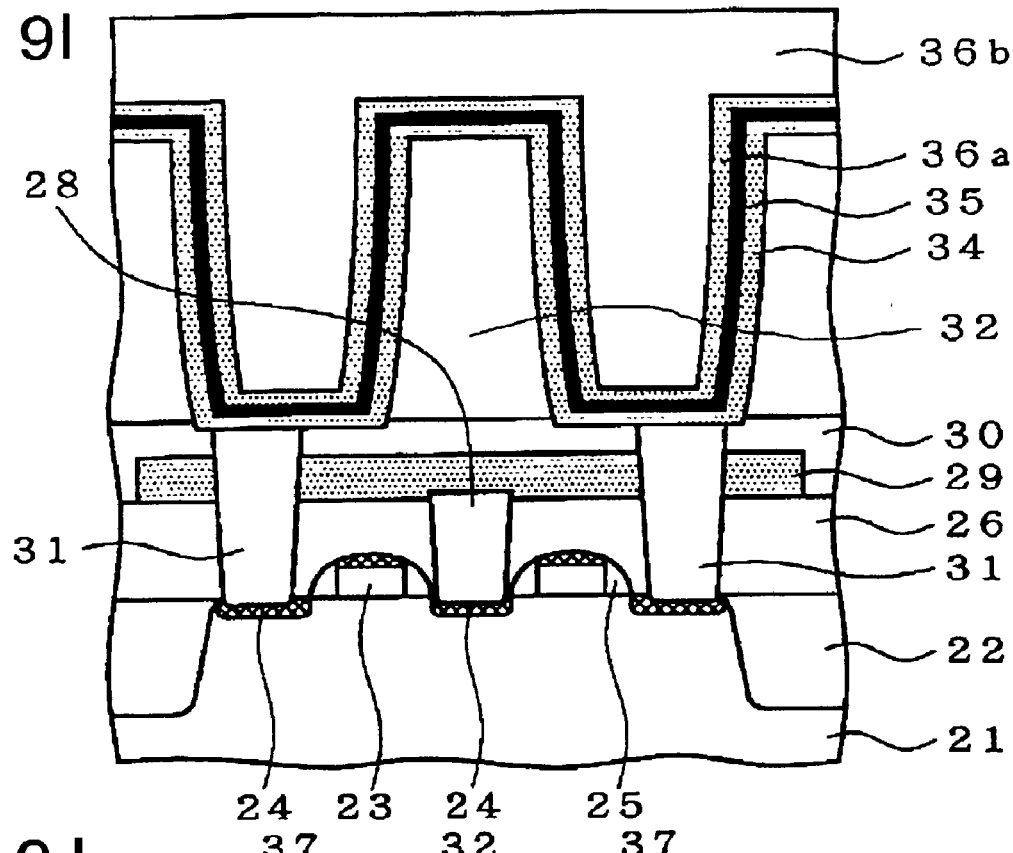

As shown in FIG. 9I, by using the ALD apparatus, a lower electrode metal 34 of TiN, a capacitor dielectric film 35 of $ZrO_2$ and an upper electrode metal 36a of TiN are continuously formed in the named order within the same machine without being exposed to air.

Figure 10:
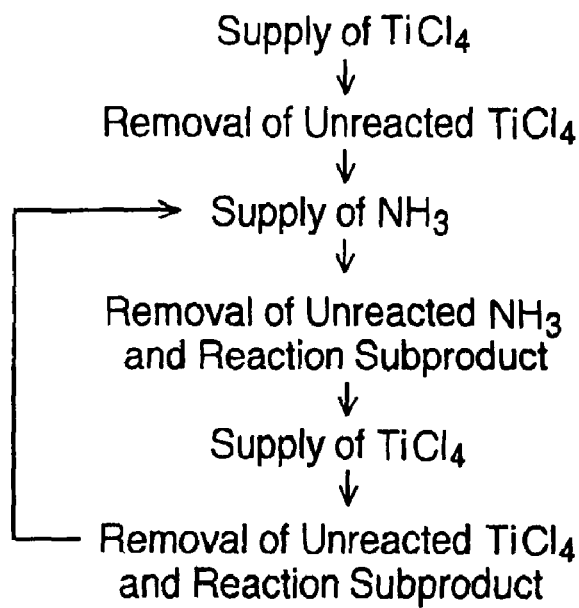
FIG. 10 is a flow chart illustrating a process for forming a TiN thin film by use of an ALD apparatus.

Here, referring to FIG. 10, there is shown a flow chart illustrating a process for forming a TiN film which constitutes the lower electrode metal 34 and the upper electrode metal 36a, by use of the ALD apparatus.

For formation of the TiN film, $TiCl_4$ and $NH_3$ are used as a starting material gas. A film deposition temperature is on the order of 300 to 500 degrees Celsius.

First, $TiCl_4$ is supplied to a chamber of the ALD apparatus. Thus, only a one-atom layer is deposited, by reaction, on a surface of the interlayer insulator film 32 including the surface of the cylinder formed in the interlayer insulator film 32. Next, the supply of $TiCl_4$ is stopped, and a purge gas is introduced into the chamber so that an excessive unreacted $TiCl_4$ is removed.

Thereafter, $NH_3$ is supplied to replace a Cl group which terminates Ti grown on the surface of the interlayer insulator film, with a $NH_2$ group. In this process, HCl is produced as a reaction subproduct. Then, the supply of $NH_3$ is stopped, and the inert gas represented by Ar or $N_2$ is introduced into the chamber as the purge gas so that an unreacted $NH_3$ and the reaction subproduct HCl are removed.

Then, $TiCl_4$ is supplied again so that only another one-atom layer is deposited. The supply of $TiCl_4$ is stopped, and the purge gas in introduced so that an unreacted $TiCl_4$ and the reaction subproduct HCl are removed. The supply of the purge gas is stopped, and $NH_3$ is supplied.

In this manner, a cycle of the $TiCl_4$ supply, the purge, the $NH_3$ supply and the purge sequentially carried in the named order, is repeated necessary times, until the lower electrode metal film 34 of TiN having the film thickness of 5 to 50 nm is obtained.

Thereafter, similarly to the procedure of the formation of the $ZrO_2$ thin film in the first embodiment as shown in FIG. 2, the capacitor dielectric film 35 of $ZrO_2$ having the film thickness of 5 to 15 nm is formed on the lower electrode metal film 34 by alternately supplying $ZrCl_4$ and $H_2O$.

Furthermore, the upper electrode metal film 36a of TiN having the film thickness of 5 to 50 nm is formed on the capacitor dielectric film 35 by alternately supplying $TiCl_4$ and $NH_3$, similarly to the procedure of the formation of the lower electrode metal film 34 as shown in FIG. 10.

In the example shown in FIG. 9I, an upper electrode metal 36b formed of W (tungsten) is deposited on the upper electrode metal film 36a so that the upper electrode is formed of a double layer consisting of a TiN layer and a W layer. In this case, the W layer is not necessarily required to be formed by use of the ALD process, but can be formed by use of a conventional CVD process or a sputtering. The ALD process expends a time since it is necessary to alternately supply the different gases. Use of the CVD process or the sputtering is effective for a mass production of the device.

This can be applied to the lower electrode 34. Namely, it is not necessary to form the whole of the lower electrode 34 by use of the ALD process. The lower electrode 34 can be formed first by the sputtering, for example, and then, only a portion of the lower electrode 34 corresponding to the boundary layer is formed by the ALD process, and thereafter, the capacitor dielectric film 35 and the upper electrode 36a are succeedingly formed by the ALD process.

In other words, the lower electrode 34 and the upper electrode 36a are sufficient if only a boundary portion to the capacitor dielectric film 35 is formed by the ALD process. Therefore, it is sufficient if the film thickness of each of the lower electrode 34 and the upper electrode 36a to be formed by the ALD process has at least one-atom layer thickness. Accordingly, only a boundary portion to the capacitor dielectric film 35, of each of the lower electrode 34 and the upper electrode 36a, is formed by the ALD process to have at least one-atom layer thickness, and the other portion of each of the lower electrode 34 and the upper electrode 36a can be formed by use of the CVD process or the sputtering so that the whole film thickness of each of the lower electrode 34 and the upper electrode 36a becomes 5 to 50 nm.

Figure 9J:
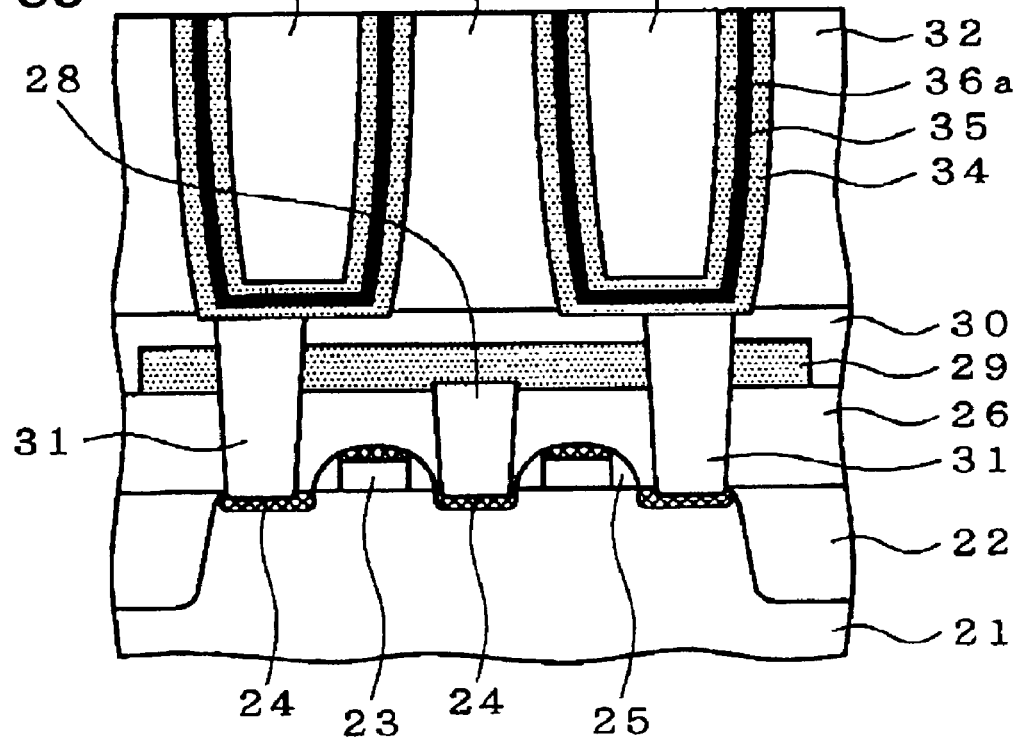

Thereafter, as shown in FIG. 9J, by a patterning using the CMP, the etch-back or the lithography, the stacked structure thus formed is divided into a plurality of individual cylinder type capacitors 37 each formed of the lower electrode 34, the capacitor dielectric film 35 and the upper electrode 36.

Figure 9K:
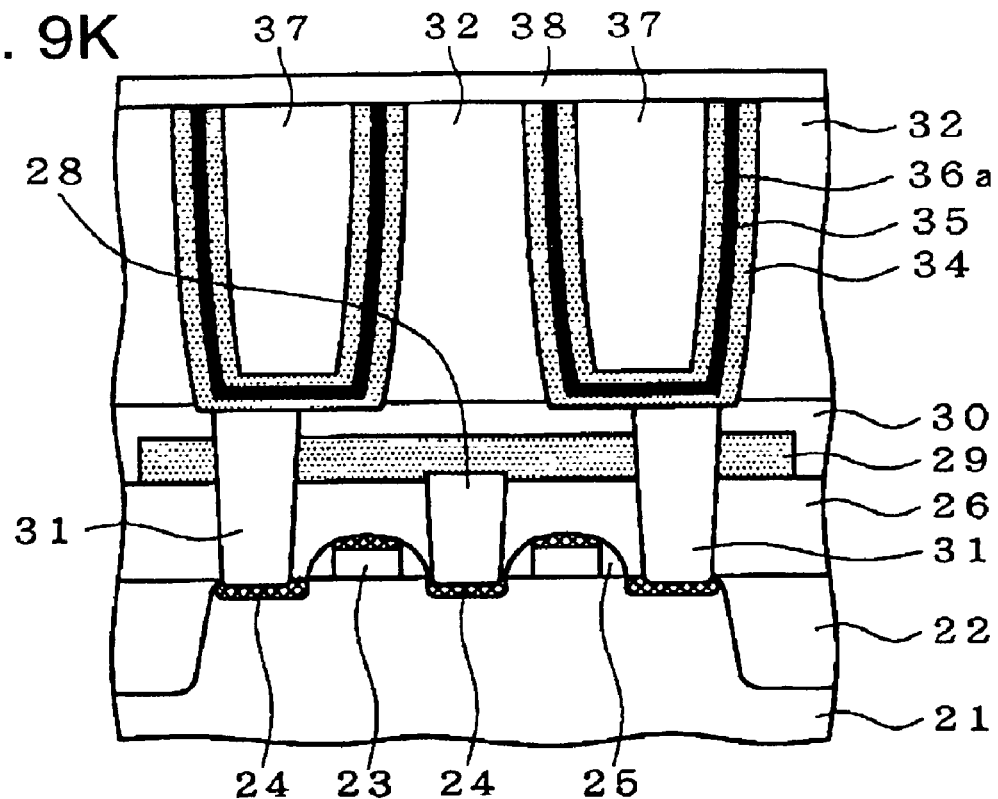

Succeedingly, as shown in FIG. 9K, an insulating film 38 is deposited on the whole surface to isolate the lower electrode 34 and the upper electrode 36 from each other.

Figure 9L:
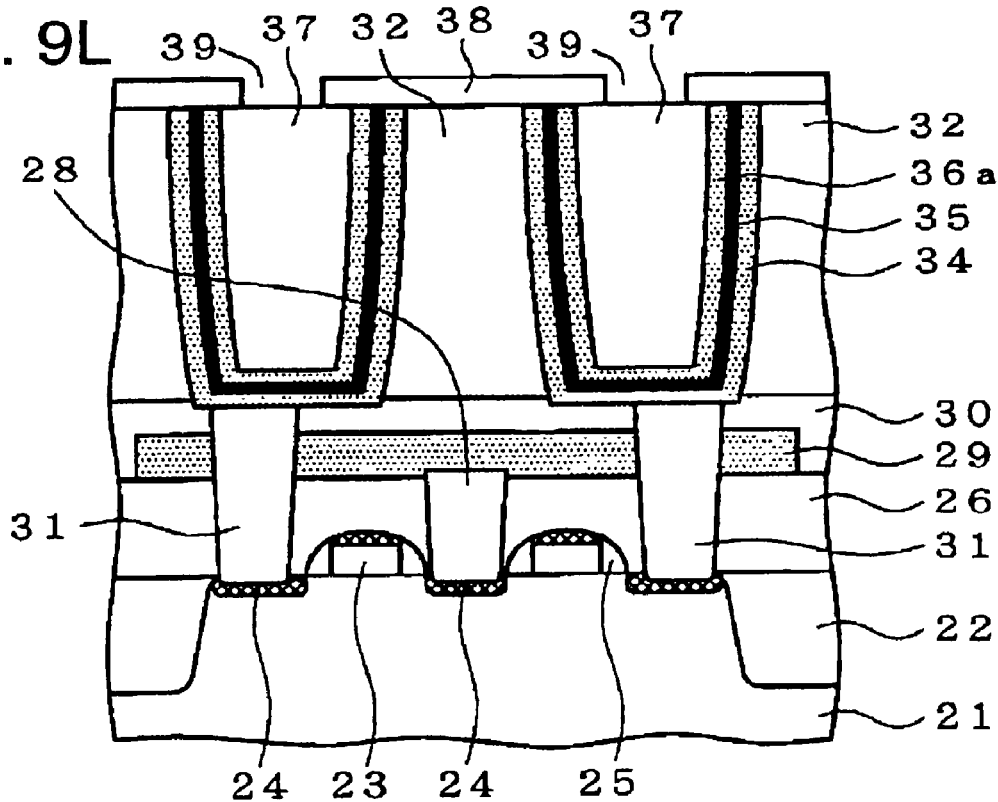

As shown in FIG. 9L, an opening 39 is formed through the insulating film 38 at only a position above the upper electrode 36 and to reach the upper electrode 36. At this time, the opening 39 never extends to the lower electrode 34.

Figure 9M:
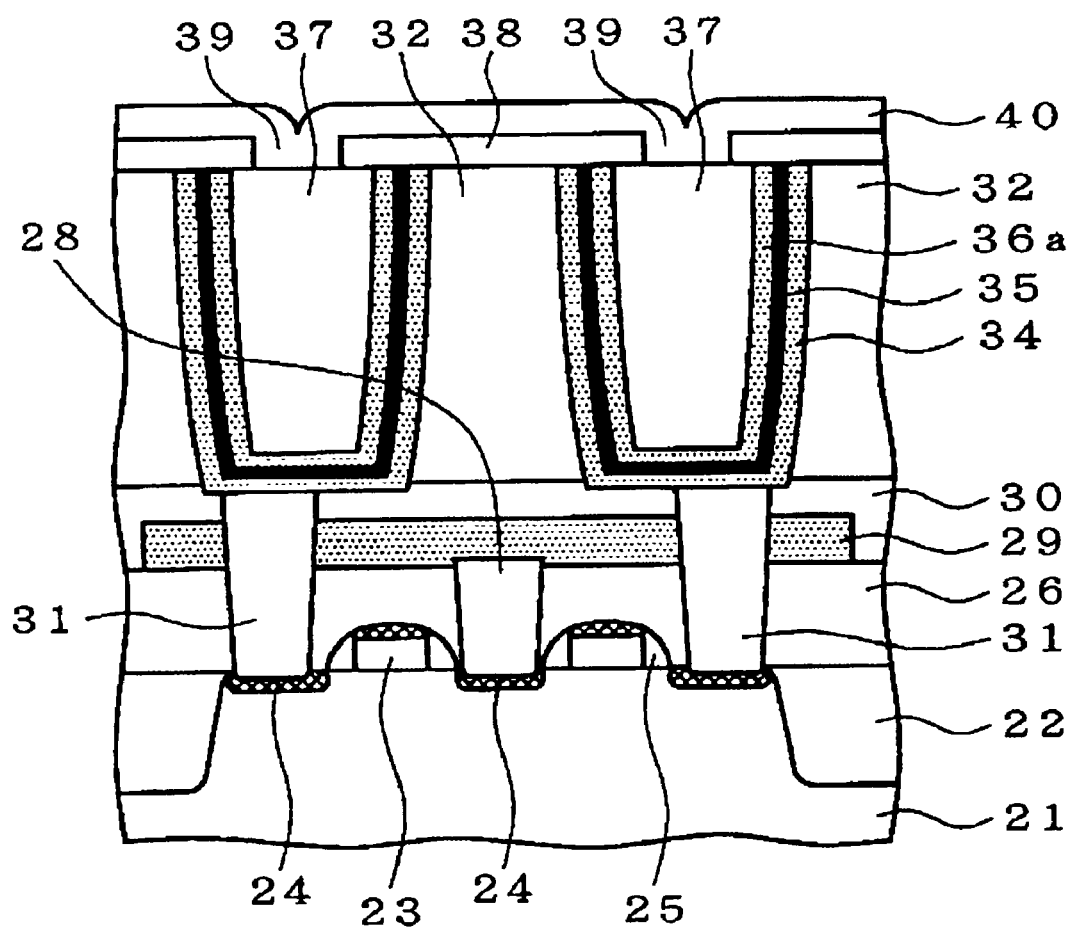

As shown in FIG. 9M, a common interconnection layer 40 is formed to cover the upper surface and to charge into the opening 39 so that the upper electrodes 36 are connected in common to the common interconnection layer 40.

Figure 9N:
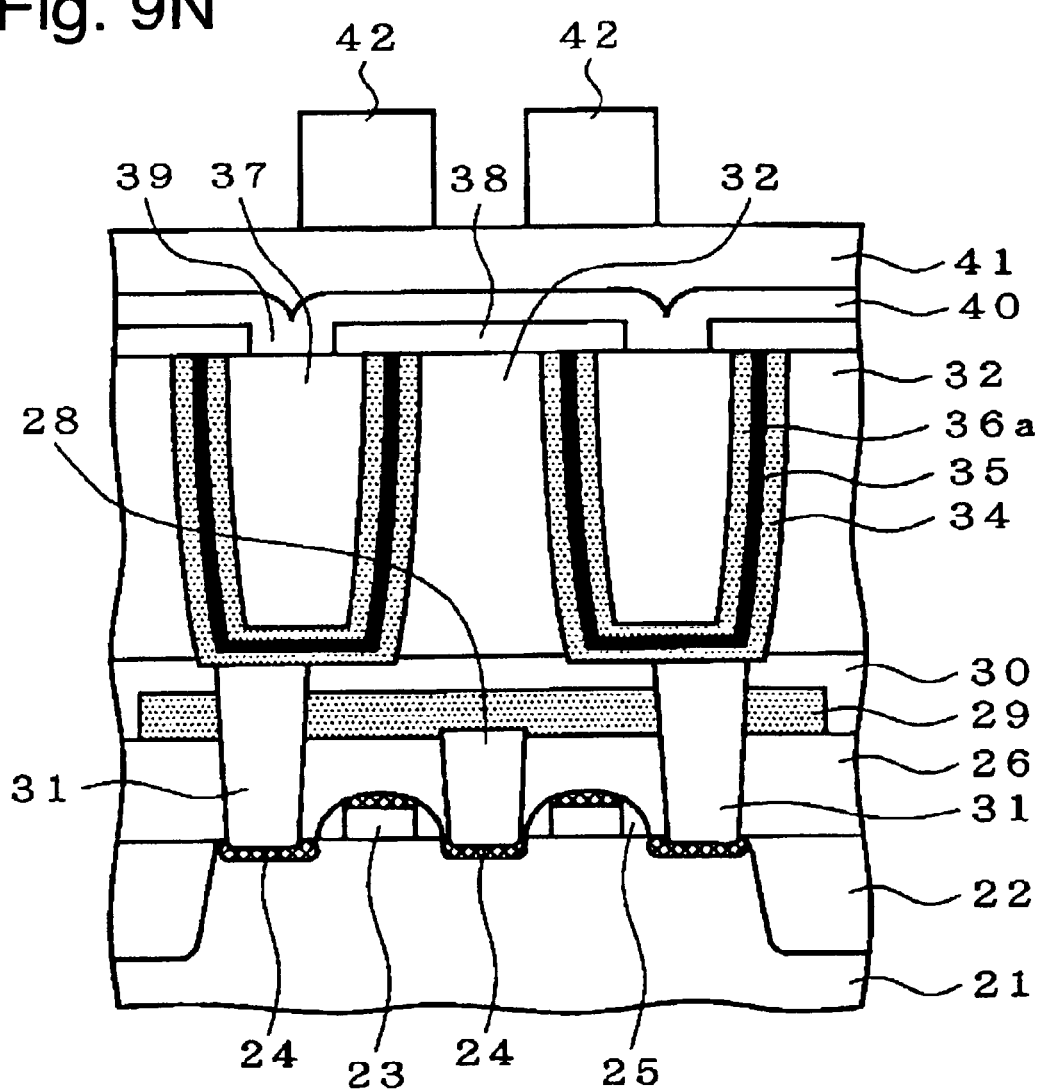

Furthermore, as shown in FIG. 9N, an interlayer insulator film 41 is formed to cover the upper surface and the common interconnection layer 40, and a first metal layer 42 is formed on the interlayer insulator film 41 so as to constitute a first level interconnection.

In this third embodiment, since the lower electrode, the capacitor dielectric film and the upper electrode are continuously formed in the same machine (the same chamber) by use of the ALD apparatus which can control the composition of the film with an atom-layer level, it is possible to perfectly prevent the chemical and physical damages to the surface of the lower electrode, which would otherwise occur when the lower electrode is patterned and when the resist is removed. In addition, it is also possible to minimize deposition of carbons included in the air within the clean room, to the surface of the lower electrode and the surface of the capacitor dielectric film. Because of these reasons, it is possible to maintain a boundary between the lower electrode and the capacitor dielectric film and a boundary between the capacitor dielectric film and the upper electrode in a good condition. Furthermore, since the boundary between the lower electrode and the capacitor dielectric film is maintained in the good condition, it is possible to minimize the capacitance drop and the increase of the capacitor dielectric film leakage current.

In addition, after the MIM structure capacitor is formed, if the anneal is carried out similarly to the capacitor of the second embodiment, it is possible to realize a capacitor having a further large capacitance and a small leakage current. In this case, the anneal is carried out at a temperature which is not lower than the $ZrO_2$ forming temperature in the ALD process but which is not higher than a temperature where no aggregation of a refractory metal silicide occurs in a gate electrode and source/drain diffused layer regions in the case that the refractory metal silicide is provided in the gate electrode and the source/drain diffused layer regions.

The present invention is in no way limited to the cylinder type capacitor, but can be applied to a planar capacitor and a box type capacitor.

Figure 11:
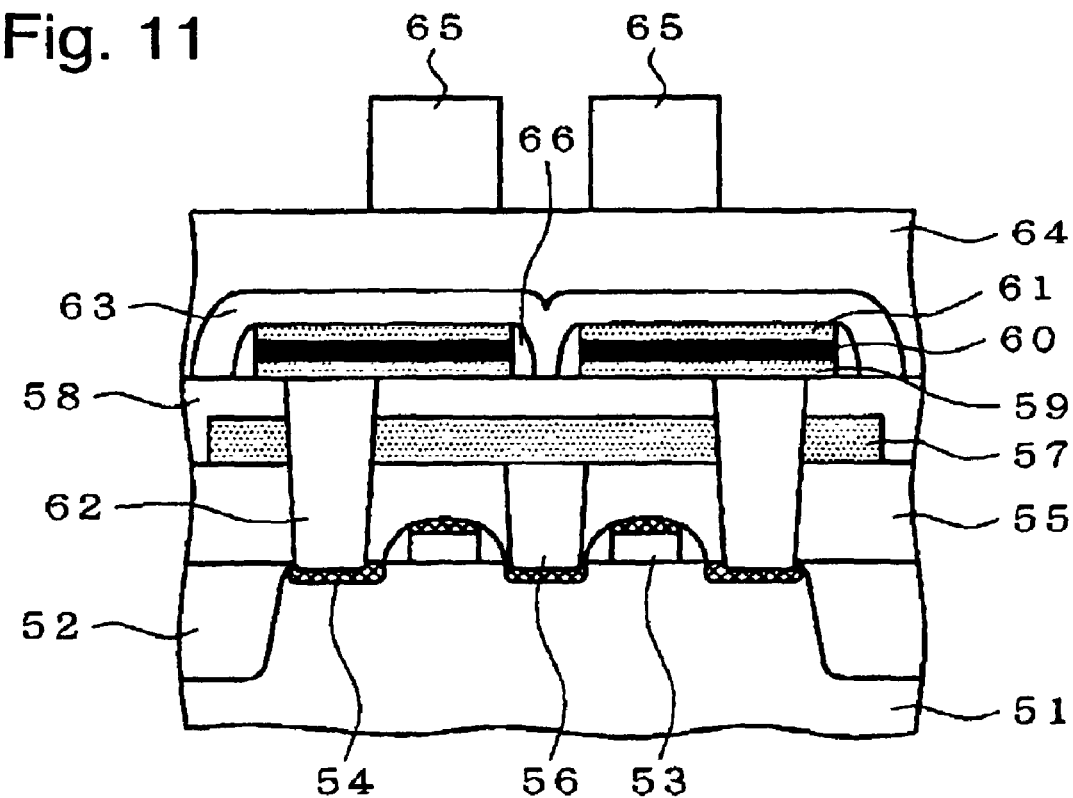
FIG. 11 is a diagrammatic sectional view of a planar capacitor.

Referring to FIG. 11, there is shown a diagrammatic sectional view of a planar capacitor to which the present invention can be applied. A device isolation region 52 is formed on a principal surface of a semiconductor substrate (silicon substrate) 51 to confirm a device formation region. In the device formation region, a gate electrode 53 is formed on a not-shown gate insulator film, and a source/drain diffused region 54 having a cobalt silicide is formed in a surface region of the substrate at each side of the gate electrode. An interlayer insulator film 55 is formed to cover the gate electrode 53 and the principal surface of the substrate.

A bit contact 56 is formed in the interlayer insulator film 55 to reach one of each pair of source/drain diffused regions 54. A bit line 57 is formed on the interlayer insulator film 55 to be electrically connected to the bit contact 56. Furthermore, an interlayer insulator film 58 is deposited to cover the bit line 57 and the interlayer insulator film 55.

On the interlayer insulator film 58, a lower electrode 59 formed of a metal of a metal nitride, a capacitor dielectric film 60 formed of $ZrO_2$, and an upper electrode 61 formed of a metal of a metal nitride, are continuously formed in the named order by the ALD apparatus. The lower electrode 59 is electrically connected to a capacitor contact 62 formed through the interlayer insulator films 58 and 55 to reach the other of each pair of source/drain diffused regions 54. A side wall 66 is formed on a side surface of each planar capacitor thus formed which is composed of the lower electrode 59, the capacitor dielectric film 60 and the upper electrode 61.

A common interconnection layer 63 is formed on the upper electrode 61 of each planar capacitor to interconnect the upper electrode 61 of the planar capacitors. An interlayer insulator film 64 is formed to cover the common interconnection layer 63, and a first metal layer 65 is formed on the interlayer insulator film 64 to constitute a first level metal interconnection.

Figure 12:
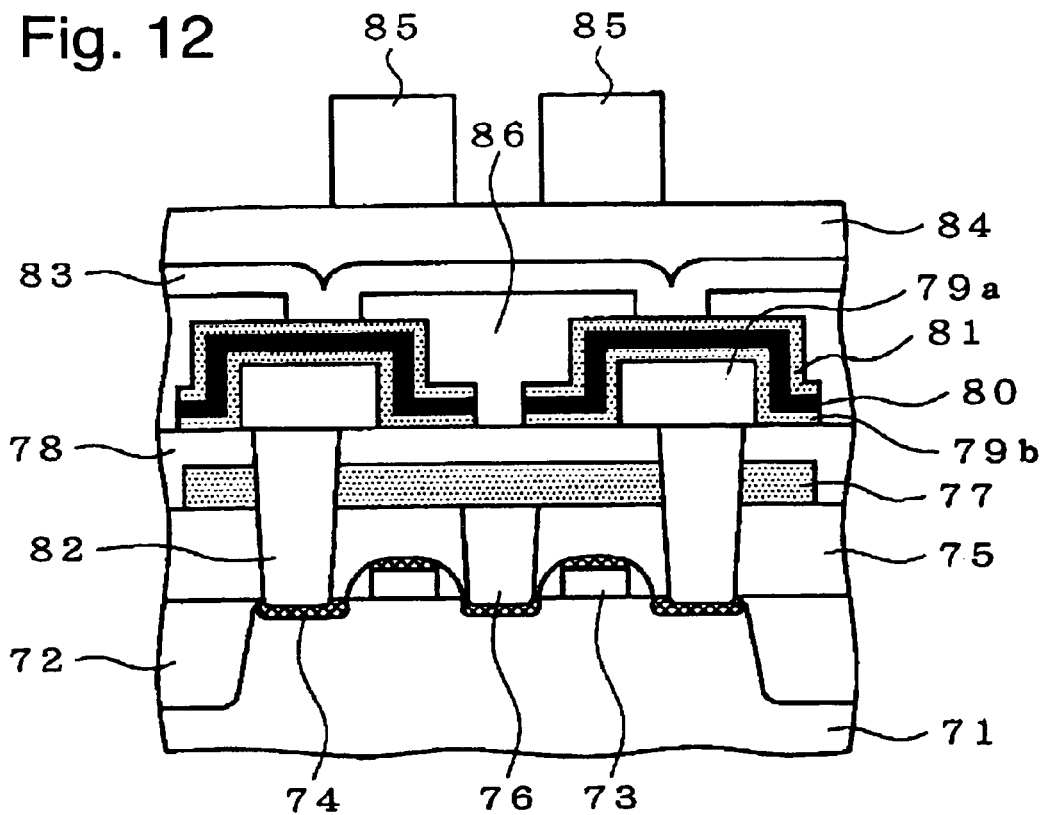
FIG. 12 is a diagrammatic sectional view of a box type capacitor.
Figure 15:
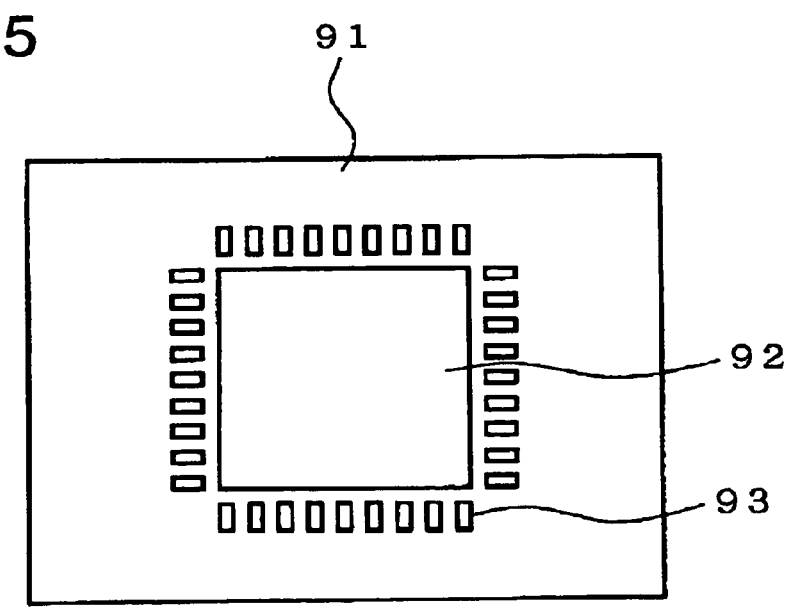
FIG. 15 illustrates a conventional decoupling capacitor.

Referring to FIG. 12, there is shown a diagrammatic sectional view of a box type capacitor to which the present invention can be applied. A device isolation region 72 is formed on a principal surface of a semiconductor substrate (silicon substrate) 71 to confirm a device formation region. In the device formation region, a gate electrode 73 is formed on a not-shown gate insulator film, and a source/drain diffused region 74 having a cobalt silicide is formed in a surface region of the substrate at each side of the gate electrode. An interlayer insulator film 75 is formed to cover the gate electrode 73 and the principal surface of the substrate.

A bit contact 76 is formed in the interlayer insulator film 75 to reach one of each pair of source/drain diffused regions 74. A bit line 77 is formed on the interlayer insulator film 75 to be electrically connected to the bit contact 76. Furthermore, an interlayer insulator film 78 is deposited to cover the bit line 77 and the interlayer insulator film 75. A capacitor contact 82 is formed through the interlayer insulator films 78 and 75 to reach the other of each pair of source/drain diffused regions 74.

On the capacitor contact 82, a lower electrode 79a of W (tungsten) is formed. To cover the lower electrode 79a and the interlayer insulator film 78, a lower electrode 79b formed of a metal of a metal nitride, a capacitor dielectric film 80 formed of $ZrO_2$, and an upper electrode 81 formed of a metal of a metal nitride, are continuously formed in the named order by the ALD apparatus. Thus, the box type capacitor is composed of the lower electrodes 79a and 79b, the capacitor dielectric film 80 and the upper electrode 81.

On the upper electrode 81, an insulator film 86 is formed to isolate the upper electrode 81 and the lower electrode 79 from each other. On the an insulator film 86, a common interconnection layer 83 is formed to interconnect the upper electrode 81b of the planar capacitors. An interlayer insulator film 84 is formed to cover the common interconnection layer 83, and a first metal layer 85 is formed on the interlayer insulator film 84 to constitute a first level metal interconnection.

Now, a fourth embodiment of the present invention will be described.

In this fourth embodiment, in a semiconductor device having a MIM thin film capacitor formed on an insulator film formed to cover an uppermost interconnection layer, a capacitor dielectric film of the MIM thin film capacitor is formed by the ALD process which can carry out a film deposition at a low temperature and which makes the post-anneal in an oxidizing atmosphere unnecessary, and the MIM thin film capacitor is located to function as a decoupling capacitor for power supply lines.

Figure 13:
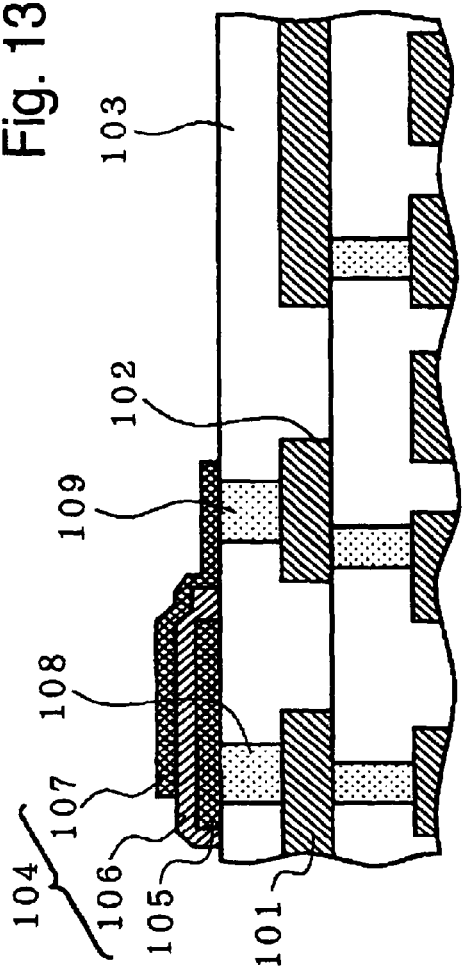
FIG. 13 is a diagrammatic sectional view illustrating a fourth embodiment of the present invention.
Figure 16:
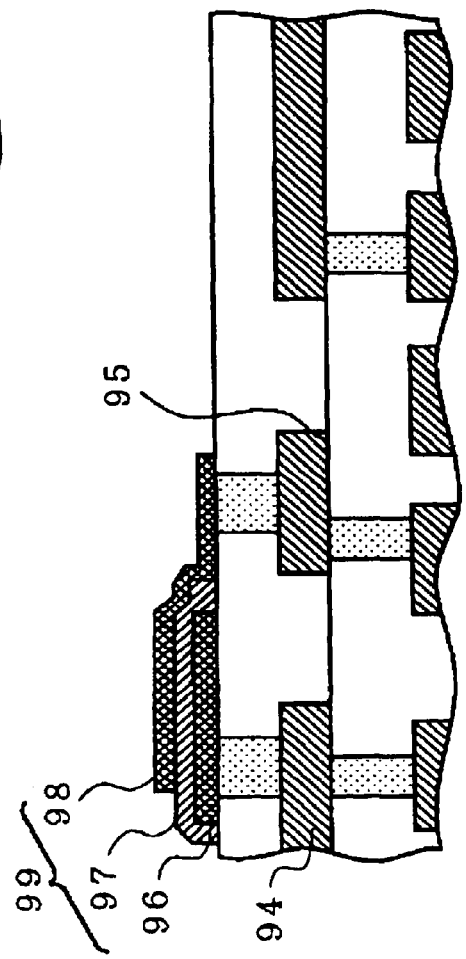
FIG. 16 illustrates a conventional thin film capacitor used as the decoupling capacitor.

Referring to FIG. 13, there is shown a diagrammatic sectional view of a part of a semiconductor device, for illustrating the fourth embodiment of the present invention.

An interlayer insulator film 103 is formed to cover an uppermost interconnection (ground line) 101, another uppermost interconnection (power supply line) 102 and an underlying interlayer insulator film. On the interlayer insulator film 103, a lower electrode 105, a capacitor dielectric film 106 and an upper electrode 107 are formed in the named order to constitute a decoupling capacitor 104. The lower electrode 105 is connected through a contact 108 to the uppermost interconnection (ground line) 101, and the upper electrode 107 is connected through a contact 109 to the uppermost interconnection (power supply line) 102.

Now, a method for forming the decoupling capacitor shown in FIG. 13 will be described.

In a logic device formed in a known fabricating process, on the interlayer insulator film 103, a lower electrode film is formed of at least one material selected from the group consisting of TiN, Ti, TaN, Ta, W, WN, Pt, Ir, Ru, by means of a sputtering process or a ALD process, and then, is patterned into a desired shape, so that the lower electrode 105 is formed at a position above the uppermost interconnection (ground line) 101 and is connected to the contact 108 reaching the uppermost interconnection (ground line) 101.

Thereafter, a capacitor dielectric film is deposited to cover the lower electrode 105 by use of the ALD process at a film deposition temperature of 200 to 400 degrees Celsius. This capacitor dielectric film is constituted of a single-layer film formed of at least one material selected from the group consisting of $ZrO_2$, $HfO_2$, $(Zr_x, Hf_{1-x})O_2 (0<x<1)$, $(Zr_y, Ti_{1-y})O_2 (0<y<1)$, $(Hf_z, Ti_{1-z})O_2 (0<z<1)$, $(Zr_k, Ti_l, Hf_m)O_2 (0<k, l, m<1, k+l+m=1)$, or alternatively, a multi-layer film formed of at least two materials selected from the group mentioned above. Then, the capacitor dielectric film is patterned into a desired shape to form the capacitor dielectric film 106.

Then, to cover the capacitor dielectric film 106, an upper electrode film is formed of at least one material selected from the group consisting of TiN, Ti, TaN, Ta, W, WN, Pt, Ir, Ru, by means of a sputtering process or a ALD process, and then, is patterned into a desired shape, so that the upper electrode 107 is formed to partially cover the capacitor dielectric film 106 and is connected to the contact 109 reaching the uppermost interconnection (power supply line) 102. Thus, the thin film capacitor functioning as the decoupling capacitor is formed in the semiconductor device.

In the embodiment shown in FIG. 13, the lower electrode is connected to the uppermost interconnection (ground line) and the upper electrode is connected to the uppermost interconnection (power supply line). However, the present invention is in no way limited to this fashion. It is a matter of course to persons skilled in the art that a similar advantage can be obtained in the case that the lower electrode is connected to the uppermost interconnection (power supply line) and the upper electrode is connected to the uppermost interconnection (ground line).

In addition, in the embodiment shown in FIG. 13, the thin film capacitor is formed over the uppermost interconnection of the semiconductor device to function as the decoupling capacitor. However, the thin film capacitor can be formed within the inside of the semiconductor device or on a lower surface of the semiconductor device.

As mentioned above, in the fourth embodiment, since a capacitor dielectric film having a high dielectric constant is formed by the ALD process which can carry out a film deposition at a low temperature and which makes the post-anneal in an oxidizing atmosphere unnecessary, the thin film capacitor can be formed in the semiconductor device with no characteristics deterioration attributable to oxidation of the interconnection layer and with no drop in yield of production.

Incorporation of the thin film capacitor in accordance with the present invention into the semiconductor device as the decoupling capacitor can overcome the problem mentioned hereinbefore of the conventional on-chip decoupling capacitor and can simultaneously realize a low inductance and a large capacitance which are advantages of the on-chip decoupling capacitor.

As mentioned above, in the MIM thin film capacitor in accordance with the present invention, since a capacitor dielectric film is formed of at least one material selected from the group consisting of $ZrO_2$, $HfO_2$, $(Zr_x, Hf_{1-x})O_2 (0<x<1)$, $(Zr_y, Ti_{1-y})O_2 (0<y<1)$, $(Hf_z, Ti_{1-z})O_2 (0<z<1)$, $(Zr_k, Ti_l, Hf_m)O_2 (0<k, l, m<1, k+l+m=1)$, it is possible to reduce a leakage current and to increase a capacitance value.

Furthermore, in the MIM thin film capacitor in accordance with the present invention, since an anneal is carried out after a capacitor dielectric film is formed of at least one material selected from the group consisting of $ZrO_2$, $HfO_2$, $(Zr_x, Hf_{1-x})O_2 (0<x<1)$, $(Zr_y, Ti_{1-y})O_2 (0<y<1)$, $(Hf_z, Ti_{1-z})O_2 (0<z<1)$, $(Zr_k, Ti_l, Hf_m)O_2 (0<k, l, m<1, k+l+m=1)$, it is possible to further reduce a leakage current and to further increase a capacitance value.

In the stacked MIM thin film capacitor in accordance with the present invention provided in a DRAM or a logic mixed DRAM, since a lower electrode, a capacitor dielectric film and an upper electrode are continuously formed in the ALD process, a silicide layer formed in a gate electrode and a source/drain diffused region is never deteriorated, and a sufficient capacitance value (a maximum capacitance value per a unitary area and a minimum leakage current value per a unitary area) can be ensured as a capacitor of each DRAM cell provided in a memory section.

Moreover, according to the present invention, since a thin film capacitor having a capacitor dielectric film formed of at least one material selected from the group consisting of $ZrO_2$, $HfO_2$, $(Zr_x, Hf_{1-x})O_2 (0<x<1)$, $(Zr_y, Ti_{1-y})O_2 (0<y<1)$, $(Hf_z, Ti_{1-z})O_2 (0<z<1)$, $(Zr_k, Ti_l, Hf_m)O_2 (0<k, l, m<1, k+l+m=1)$, is formed over an uppermost interconnection layer in a semiconductor device, it is possible to realize a low-inductance, large-capacitance, one-chip decoupling capacitor, which meets with a speedup of an LSI.

The invention has thus been shown and described with reference to the specific embodiments. However, it should be noted that the present invention is in no way limited to the details of the illustrated structures but changes and modifications may be made within the scope of the appended claims.

The invention claimed is:

1. A semiconductor device comprising a transistor having source and drain regions and a capacitor, said capacitor being of a MIM (metal-insulator-metal) structure and having a lower metal electrode connected through a metal plug to one of the source and drain regions of said transistor, a capacitor dielectric film formed on said lower metal electrode and an upper metal electrode formed on said capacitor dielectric film, said capacitor dielectric film being formed of a dielectric material which is selected from the group consisting of $ZrO_2$, $HfO_2$, $(Zr_x, Hf_{1-x})O_2 (0<x<1)$, $(Zr_y, Ti_{1-y})O_2 (0<y<1)$, $(Hf_z, Ti_{1-z})O_2 (0<z<1)$, and $(Zr_k, Ti_l, Hf_m)O_2 (0<k, l, m<1, k+l+m=1)$, and said capacitor dielectric film having a film thickness of 5 to 15 nm.

2. The device as claimed in claim 1, wherein each of said lower and upper metal electrodes of said capacitor is formed of a metal material selected from the group consisting of TiN, Ti, W, WN, Pt, Ir and Ru.

3. The device as claimed in claim 2, wherein a refractory metal silicide layer intervenes between said one of the source and drain regions of said transistor and said metal plug.

4. The device as claimed in claim 1, wherein said dielectric material is $ZrO_2$.

5. The device as claimed in claim 1, wherein said dielectric material is $HfO_2$.

6. A semiconductor device comprising a semiconductor substrate, a transistor having first and second diffusion regions selectively formed in said semiconductor substrate, first and second metal silicide layers formed in respective surface portions of said first and second diffusion regions, a first insulating layer formed to cover said semiconductor substrate and said transistor and having first and second holes extending to respective parts of said first and second metal silicide layers, first and second metal plugs filling respectively said first and second holes, a bit line formed over said first insulating layer in contact with said first metal plug, a second insulating layer formed over said first insulating layer and said bit line and having a third contact hole, a third metal plug filling said third hole, and a capacitor formed in electrical contact with said third metal plug, said capacitor having a lower metal electrode formed in contact with said third metal plug, a dielectric film formed on said lower metal electrode and made of a dielectric material selected from the group consisting of $ZrO_2$, $HfO_2$, $(Zr_x, Hf_{1-x})O_2 (0<x<1)$, $(Zr_y, Ti_{1-y})O_2 (0<y<1)$, $(Hf_z, Ti_{1-z})O_2 (0<z<1)$, and $(Zr_k, Ti_l, Hf_m)O_2 (0<k, l, m<1, k+l+m=1)$, and an upper metal electrode formed on said dielectric film, and said dielectric film having a film thickness of 5 to 15 nm.

7. The device as claimed in claim 6, wherein each of said first and second metal silicide layers is made of cobalt silicide or nickel silicide.

8. The device as claimed in claim 7, wherein each of said lower and upper electrodes of said capacitor is made of TiN.

9. The device as claimed in claim 6, wherein said dielectric material is $ZrO_2$.

10. The device as claimed in claim 6, wherein said dielectric material is $HfO_2$.

11. A semiconductor device comprising a transistor having a gate electrode forming a word line in a DRAM, and source and drain regions; a bit line connected through a bit line contact to one of said source and drain regions of said transistor and a capacitor connected through a capacitor contact to the other of said source and drain regions of said transistor, said capacitor being of a stacked three-dimensional MIM (metal-insulator-metal) structure and having a lower electrode lining a hole formed in an interlayer insulator film, a capacitor dielectric film formed on a metal surface of said lower electrode and an upper electrode formed on said capacitor dielectric film, said capacitor dielectric film and said upper electrode each extending into said hole in said interlayer insulator film, said capacitor dielectric film comprising a dielectric material which is selected from the group consisting of $ZrO_2$, $HfO_2$, $(Zr_x, Hf_{1-x})O_2(0<x<1)$, $(Zr_y, Ti_{1-y})O_2(0<y<1)$, $(Hf_z, Ti_{1-z})O_2(0<z<1)$, and $(Zr_k, Ti_l, Hf_m)O_2(0<k, l, m<1, k+l+m=1)$, and said capacitor dielectric film having a film thickness of 5 to 15 nm.

12. The device as claimed in claim 11, wherein each of said lower and upper electrodes of said capacitor comprises at least one metal material selected from the group consisting of TiN, Ti, W, WN, Pt, Ir and Ru.

13. The device as claimed in claim 11, wherein a refractory metal silicide layer is formed on said source and drain regions of said transistor.

14. The device as claimed in claim 13, wherein said refractory metal silicide layer comprises cobalt silicide or nickel silicide.

15. The device as claimed in claim 11, wherein each of said lower and upper electrodes of said capacitor comprises a TiN surface contacting said capacitor dielectric film.

16. The device as claimed in claim 11, wherein said bit line contact and said capacitor contact comprise a metal material.

17. The device as claimed in claim 16, wherein said bit line contact and said capacitor contact comprise tungsten.

18. The device as claimed in claim 11, wherein said dielectric material comprises $ZrO_2$.

19. The device as claimed in claim 11, wherein said dielectric material comprises $HfO_2$.

20. The device as claimed in claim 11, wherein each of said lower and upper electrodes of said capacitor comprises TiN.

21. The device as claimed in claim 11, wherein each of said lower and upper electrodes of said capacitor comprises TiN and wherein said dielectric material comprises $ZrO_2$.

22. The device as claimed in claim 11, wherein each of said lower and upper electrodes of said capacitor comprises TiN and wherein said dielectric material comprises $HfO_2$.

* * * * *